United States Patent
Fujioka et al.

(10) Patent No.: US 6,459,641 B2
(45) Date of Patent: Oct. 1, 2002

(54) SEMICONDUCTOR MEMORY DEVICE

(75) Inventors: Shinya Fujioka; Masao Taguchi; Waichirou Fujieda; Yasuharu Sato; Takaaki Suzuki; Tadao Aikawa; Takayuki Nagasawa, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/834,945

(22) Filed: Apr. 16, 2001

Related U.S. Application Data

(60) Continuation of application No. 09/533,759, filed on Mar. 23, 2000, now Pat. No. 6,246,620, which is a division of application No. 09/147,600, filed as application No. PCT/JP98/02443 on Jun. 3, 1998, now Pat. No. 6,088,291.

(30) Foreign Application Priority Data

Jun. 3, 1997 (JP) .............................. 9-145406
Aug. 8, 1997 (JP) .............................. 9-215047
Dec. 3, 1997 (JP) .............................. 9-332739

(51) Int. Cl.$^7$ ................................. G11C 7/00
(52) U.S. Cl. ...................... 365/220; 365/233
(58) Field of Search ............... 365/205, 220, 365/189.01, 230.01, 233

(56) References Cited

U.S. PATENT DOCUMENTS

| | | | |
|---|---|---|---|
| 4,376,989 A | 3/1983 | Takemae | |
| 5,926,839 A | 7/1999 | Katayama | 711/169 |
| 6,088,291 A | 7/2000 | Fujioka | 365/233 |
| 6,240,046 B1 * | 5/2001 | Proebsting | 365/233 |
| 6,246,620 B1 * | 6/2001 | Fujioka et al. | 365/205 |
| 6,288,928 B1 * | 9/2001 | Shinozaki | 365/63 |
| 6,373,783 B1 * | 4/2002 | Tomita | 365/233 |

FOREIGN PATENT DOCUMENTS

| | | |
|---|---|---|
| JP | 60-689 | 1/1985 |
| JP | 60-000689 | 1/1985 |
| JP | 63-247995 | 10/1988 |
| JP | 1-286197 | 11/1989 |
| JP | 4-147492 | 5/1992 |
| JP | 5-507374 | 10/1993 |
| JP | 6-84351 | 3/1994 |
| JP | 6-168590 | 6/1994 |
| JP | 7-45067 | 2/1995 |
| JP | 7-254278 | 10/1995 |
| JP | 8-17184 | 1/1996 |
| JP | 8-017184 | 1/1996 |
| JP | 9-63264 | 3/1997 |
| JP | 9-161471 | 6/1997 |
| JP | 9-180437 | 7/1997 |
| JP | 9-180455 | 7/1997 |
| JP | 10-255476 | 9/1998 |
| WO | WO 91/16680 | 10/1991 |

* cited by examiner

Primary Examiner—Terrell W. Fears
(74) Attorney, Agent, or Firm—Arent Fox Kintner Plotkin & Kahn, PLLC

(57) ABSTRACT

The present invention is aimed at providing a semiconductor memory device which performs a row-address pipe-line operation in accessing different row addresses so as to achieve high-speed access. The semiconductor memory device according to the present invention includes a plurality of sense-amplifiers which store data when the data is received via bit lines from memory cells corresponding to a selected word line, a column decoder which reads parallel data of a plurality of bits from selected sense amplifiers by simultaneously selecting a plurality of column gates in response to a column address, a data-conversion unit which converts the parallel data into serial data, and a precharge-signal-generation unit which generates an internal precharge signal a first delay-time period after generation of a row-access signal for selecting the selected word line so as to reset the bit lines and said plurality of sense-amplifiers.

11 Claims, 38 Drawing Sheets

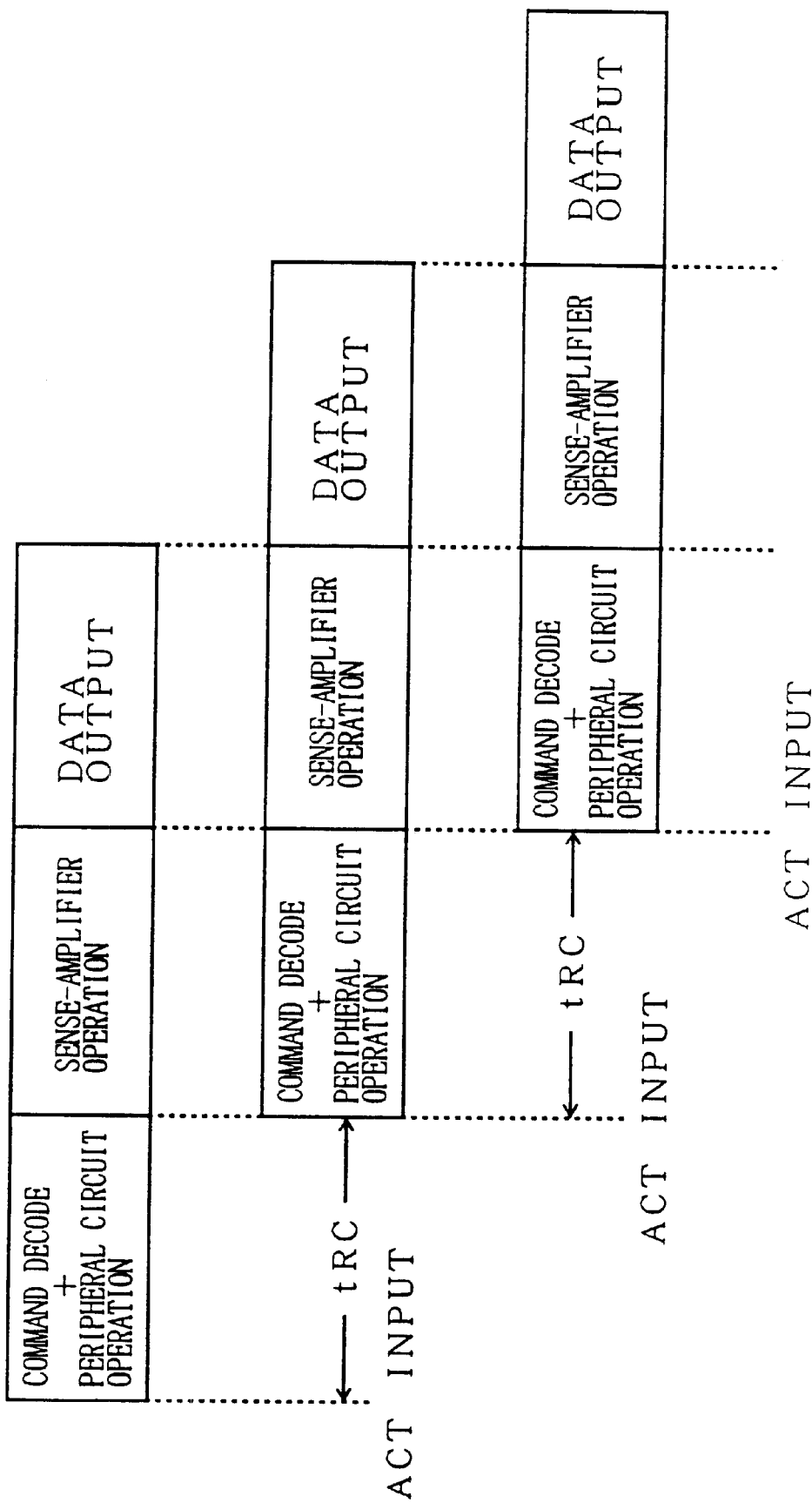

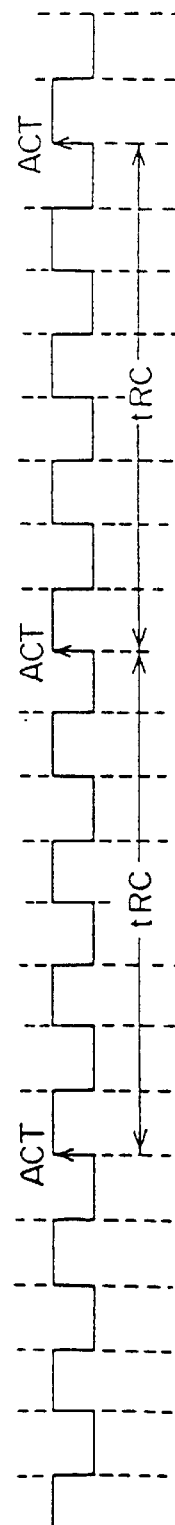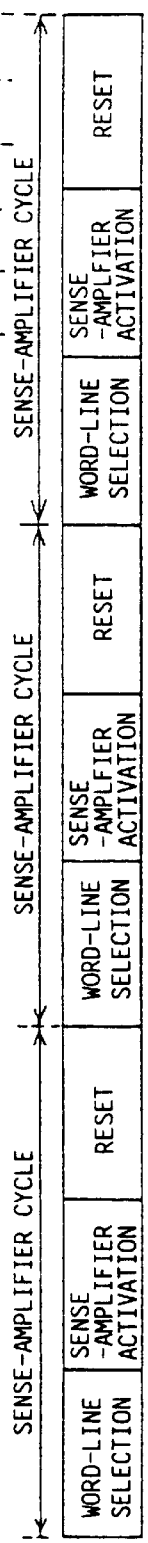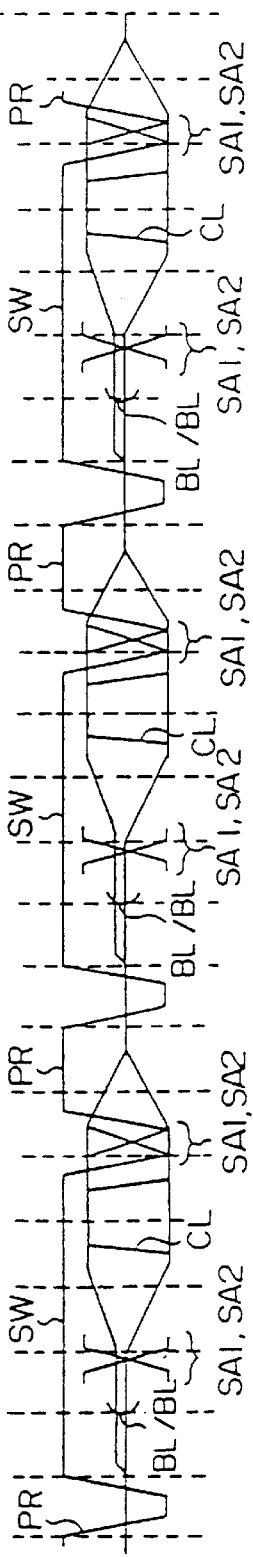

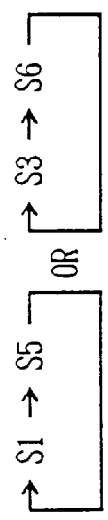

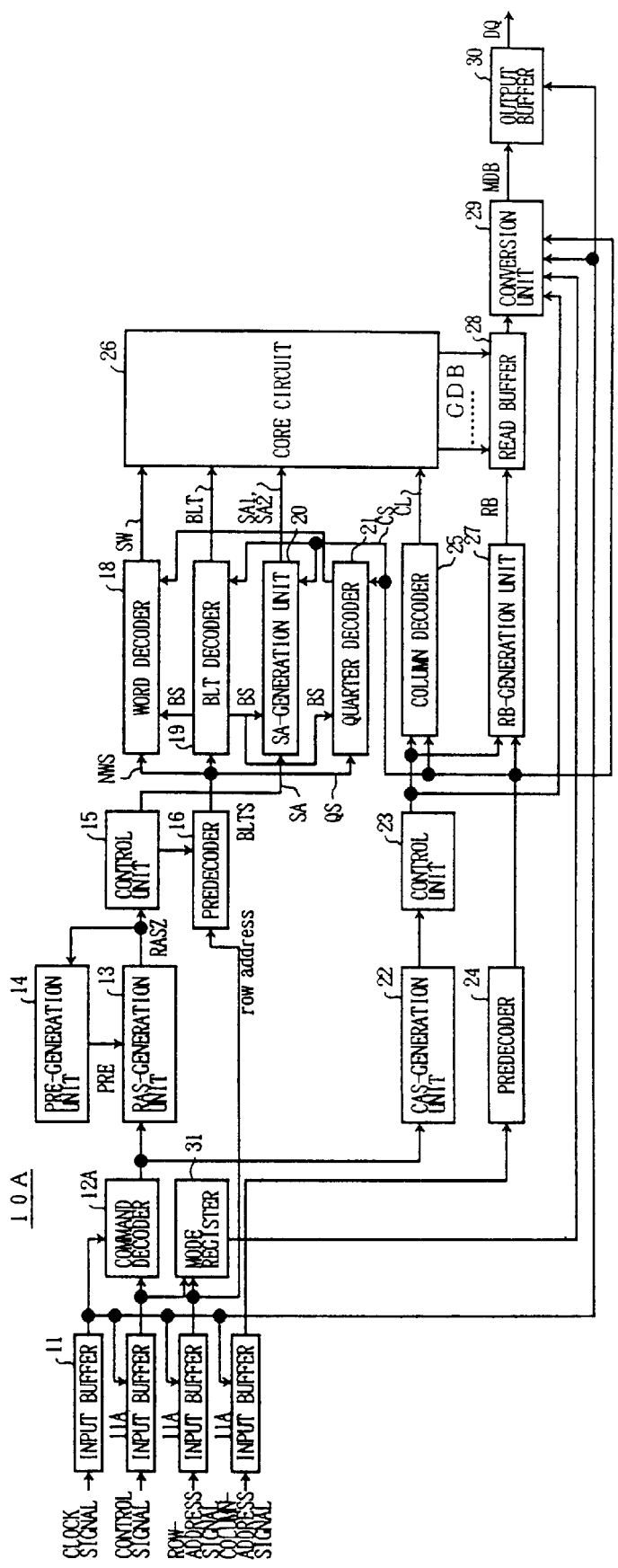
F I G. 3 0

FIG. 32

|  | BL=4 | BL=2 | | BL=1 | | | |
|---|---|---|---|---|---|---|---|
| caa0, 1z | — | L/− | H/− | L/L | H/L | L/H | H/H |
| sw1n | close | close | open | close | open | open | open |
| sw2n | close | close | open | close | close | close | close |
| sw3n | close | close | close | close | close | close | close |
| sw24 | open | open | close | open | open | open | open |
| sw14 | open | open | open | open | open | open | close |
| sw13 | open | open | close | open | open | close | open |
| sw12 | open | open | open | open | close | open | open |

FIG. 35A

|  | BL=4 | BL=2 | BL=1 |
|---|---|---|---|
| outp0z<br>outp1z | clocking<br>clocking | clocking<br>clocking | clocking<br>— |

FIG. 35B

|  | BL=4 | BL=2 | BL=1 |
|---|---|---|---|
| psclk1z<br>psclk2z<br>psclk3z<br>psclk0z | clocking<br>clocking<br>clocking<br>clocking | clocking<br>clocking<br>—<br>— | clocking<br>—<br>—<br>— |

LATCH PERIOD

US 6,459,641 B2

1

SEMICONDUCTOR MEMORY DEVICE

This application is a continuation of Ser. No. 09/533,759 filed Mar. 23, 2000, now U.S. Pat. No. 6,246,620 which is a division of Ser. No. 09/147,600, filed Jan. 29, 1999 now U.S. Pat. No. 6,088,291 which is a 371 of PCT/JP98/02443 filed Jun. 3, 1998.

FIELD OF THE INVENTION

The present invention generally relates to semiconductor devices, and particularly relates to a semiconductor memory device which operates in synchronism with a clock signal.

BACKGROUND OF THE INVENTION

As processing speed of CPUs is enhanced, semiconductor memory devices such as a DRAM (dynamic random access memory) are required to have an increased data-transfer speed by using an increased signal frequency for input/output of data signals. SDRAMs (synchronous dynamic random access memory) are devised to meet this demand, and operate in synchronism with an input clock signal to achieve a high-operation speed.

FIG. 1 is a circuit diagram showing a portion of a DRAM with regard to peripherals of memory cells. The circuit of FIG. 1 includes a capacitor 501, NMOS transistors 502 through 512, a PMOS transistor 513, PMOS transistors 521 and 522, and NMOS transistors 523 and 524. The PMOS transistors 521 and 522 and the NMOS transistors 523 and 524 together form a sense amplifier 520.

The capacitor 501 serving as a memory cell stores 1-bit information. When a sub-word-line selecting signal SW is activated, the NMOS transistor 502 serving as a cell gate opens, thereby transferring data of the capacitor 501 to a bit-line BL. When this happens, a bit-line-transfer signal BLT1 is at a HIGH level, so that the NMOS transistors 503 and 504 are turned on. A bit-line-transfer signal BLT0, on the other hand, is at a LOW level, so that the NMOS transistors 505 and 506 are turned off. As a result, the data on the bit-lines BL and /BL is stored in the sense amplifier 520 via the NMOS transistors 503 and 504. The sense amplifier 520 operates when the transistors 513 and 512 are turned on via activation of sense-amplifier-activation signals SA1 and SA2, and amplifies the data of the bit-lines BL and /BL. The amplified data on the bit-lines BL and /BL is then sent to data bus DB and /DB via the NMOS transistors 510 and 511 serving as column gates when a column-line selecting signal CL is selectively activated.

In the case of data-write operations, data on the data bus DB and /DB is stored in the capacitor 501 through operation steps reversed in order with reference to the case of data-read operations.

FIG. 2 is timing charts for explaining data-read operations of the DRAM.

As shown in FIG. 2, when data-read operations are conducted, commands are input to the DRAM in an order of a precharge command (PRE) for precharging the bit-lines BL and /BL to a predetermined voltage level, a /RAS command (R) for a row-access operation, and a /CAS command (C) for a column-access operation.

With reference to FIG. 1 and FIG. 2, timing control will be described below with regard to data-read operations.

Upon input of the /RAS command, the bit-line-transfer signal BLT0 becomes LOW (BLT1 is HIGH), so that the bit-lines BL and /BL are connected to the sense amplifier 520. At the same time, a precharge signal PR of FIG. 1 is

2 changed to LOW to end the reset conditions of the bit-lines BL and /BL. Further, a main-word-line selecting signal MW is changed to HIGH, and so is the sub-word-line selecting signal SW, thereby selecting a particular word line. This turns on the NMOS transistor 502, so that the data of the capacitor 501 is read to the bit-line BL. As shown in FIG. 2, the data appears on the bit-line BL at a timing when the main-word-line selecting signal MW and the sub-word-line selecting signal SW become HIGH.

In order to drive the sense amplifier 520, then, sense-amplifier driving signals SA1 and SA2 become active, thereby turning on the NMOS transistor 512 and the PMOS transistor 513. As shown in FIG. 2, activation of the sense amplifier 520 results in an increase in the amplitude of data signals on the bit-lines BL and /BL.

When the amplitude of data signals is stepped up, the column-line selecting signal CL becomes HIGH in response to the /CAS command so as to select a particular column. The NMOS transistors 510 and 511 (column gates) of the selected column are turned on, so that the data is released to the data bus DB and /DB. The data on the data bus DB and /DB is output from the DRAM as a data signal DQ, and, for example, a data-read operation for consecutive four bits is conducted.

When the precharge command is input, the precharge signal PR becomes HIGH at an appropriate timing, so that the NMOS transistors 507 through 509 are turned on to precharge the bit-lines BL and /BL to a voltage VPR. This operation resets the bit-lines BL and /BL as shown in FIG. 2, and, thus, the DRAM is prepared for a data-read operation of a next /RAS command.

The DRAM as described above can consecutively read data from different column addresses by successively selecting different columns, and this operation is applicable when data is consecutively read from the same row address (corresponding to the same word line). The sense amplifier 520 of FIG. 1 is provided with respect to each of a plurality of columns. The plurality of sense amplifiers 520 store data of different column addresses and the same row address. When these different column addresses are successively selected to read data from the sense amplifier 520, therefore, consecutive data-read operations can be achieved.

When there is a need to read data from a different row address (corresponding to a different word line), however, new data needs to be read from memory cells of this word line to the bit-lines BL and /BL. Further, in order to transfer the new data to the bit-lines BL and /BL, it is required to precharge the bit-lines BL and /BL in advance. Because of this, when data is to be read from a different row address after having read data from a given row address, successive data-read timings have a large time gap therebetween as shown in FIG. 2. In the example of FIG. 2, there is a gap as large as 10 clocks between successive data-read timings for different row addresses.

For the sake of explanation, a whole series of operations from the input of a row address to the output of data is divided into three steps. The first step includes command-decode operations and peripheral-circuit operations, and the second step is comprised of sense-amplifier operations. The third step relates to data-output operations. In order to achieve pipe-line operations with regard to row access, the operations of the first step are initially conducted with regard to a first row access. When the operations of the second step start with regard to the first row access, a second row access begins the operations of the first step. Further, when the first row access starts the operations of the third step, the operations of the second step are conducted with regard to the second row access, and, also, the operations of the first step should start with regard to a third row access. In this manner, row-access pipe-line operations can be achieved if the operations of the first, second, and third steps are performed in parallel with respect to different row accesses.

In conventional DRAMs, however, a burst length can be set to different lengths when a plurality of column addresses are consecutively read at the same row address. That is, the number of data pieces subjected to consecutive data-read operations is defined by a specified burst length, and a corresponding number of data pieces, as indicated by the specified burst length, are read from consecutive column addresses. In this case, an operation period of the sense-amplifier operations at the second step, i.e., a period during which the sense amplifiers are operating to allow accesses to be made to consecutive column addresses, is subject to a change, depending on a burst length which is determined by a mode setting.

Since the operation period of the second step is subject to a change dependent on a mode setting, it is impossible to carry out undisturbed pipe-line operations with regard to row accesses. Namely, when situations are viewed from the side of a memory controller, the memory controller is not allowed to supply the /RAS commands (or activation commands) successively at constant intervals. Further, there is a need to change input timings of precharge commands in accordance with burst lengths, which also makes it difficult to perform row-access pipe-line operations.

Accordingly, there is a need for a semiconductor memory device which achieves row-access pipe-line operations when different row addresses are accessed.

SUMMARY OF THE INVENTION

A semiconductor memory device according to the present invention includes a plurality of sense-amplifiers which store data when the data is received via bit lines from memory cells corresponding to a selected word line, a column decoder which reads parallel data of a plurality of bits from selected sense amplifiers by simultaneously selecting a plurality of column gates in response to a column address, a data-conversion unit which converts the parallel data into serial data, and a precharge-signal-generation unit which generates an internal precharge signal a first delay-time period after generation of a row-access signal for selecting the selected word line so as to reset the bit lines and the plurality of sense-amplifiers.

In the semiconductor memory device described above, when a series of operations from row-address input to data output is divided into command-decode and peripheral-circuit operations of a first step, sense-amplifier operations of a second step, and data-output operations of a third step, the sense-amplifier operations of the second step have a constant operation period irrespective of a specified burst length. Since the data of the sense amplifiers is read in parallel by simultaneously opening a plurality of column gates, it is sufficient for the sense amplifiers to operate only for a constant time period. This allows the period of the sense-amplifier operations of the second step to be constant, thereby achieving undisturbed row-access pipe-line operations. If it is incumbent upon the user to determine the precharge timing from outside of the semiconductor memory device, arbitrary nature of the precharge timing works as one of the causes to disturb the pipe-line operations. The present invention, however, uses the internal precharge signal to initiate reset operations, so that such a cause of disturbance is eliminated. Further, the precharge operation can be conducted at an optimum timing immediately after the data is read from the sense amplifiers, thereby achieving high-speed data-read operations having a high performance limited only by the capacity of sense-amplifier operations.

Further, according to the present invention, the data-conversion unit outputs the serial data by selecting a predetermined number of bits from the plurality of bits of the parallel data in accordance with a burst-length signal. Because of this, undisturbed row-access pipe-line operations can be performed while allowing a data read operation to cope with different burst-length settings.

Moreover, according to the present invention, the plurality of bits of the parallel data are read from the sense amplifiers in response to a single row access, and are converted into serial data to be output to an exterior of the semiconductor memory device. This achieves continuous data outputting without any break.

In addition, according to the present invention, the semiconductor memory device receives a row-access command and a column-access command as a single packet. Accordingly, a reduction in a row-access time leads to a reduction in time intervals between input commands. The row-access command and the column-access command may be input at two consecutive clock pulses, for example.

Further, according to the present invention, the precharge-signal-generation unit resets the bit lines and the sense amplifiers by using the internal precharge signal immediately after the parallel data is read from the sense amplifiers. Such an automatic precharge immediately after data access to the sense amplifiers can reduce intervals between row accesses as much as possible.

Moreover, according to the present invention, the precharge-signal-generation unit uses a series of delay elements for delaying signals by the first delay-time period, and, thus, can be implemented via a simple circuit structure.

Further, according to the present invention, the sense amplifiers are grouped into a plurality of sense-amplifier blocks such that row-access operations are performed only with respect to a selected one of the sense-amplifier blocks. This makes it possible to reduce the number of sense amplifiers driven at the same time, thereby reducing the load on control signals used in the row-access operations. This increases signal switching speed, and achieves signal control of such a high speed as to be in commensurate with a reduction in time intervals between the row accesses.

Moreover, according to the present invention, the semiconductor memory device further includes word decoders corresponding to the respective sense-amplifier blocks, the word decoders connecting the memory cells to the bit lines only with respect to the selected one of the sense-amplifier blocks at a time of the row access. The word decoders provided for the respective sense-amplifier blocks makes it possible to reduce the load on word-selection signals used in the row-access operations. This increases signal switching speed, and achieves control of the word-selection signals at such a high speed as to be in commensurate with a reduction in time intervals between the row accesses.

Further, according to the present invention, bit-line-transfer-signal-generation units corresponding to the respective sense-amplifier blocks are provided, and connect the bit lines to the sense amplifiers only with respect to the selected one of the sense-amplifier blocks at a time of the row access. The bit-line-transfer-signal-generation units provided for the respective sense-amplifier blocks make it possible to reduce the load on bit-line-transfer signals used in the row-access operations. This increases signal switching speed, and achieves control of the bit-line-transfer signals at such a high speed as to be in commensurate with a reduction in time intervals between the row accesses.

Further, according to the present invention, sense-amplifier-driving-signal-generation units corresponding to the respective sense-amplifier blocks are provided, and activate the sense amplifiers only with respect to the selected one of the sense-amplifier blocks at a time of the row access. The sense-amplifier-driving-signal-generation units provided for the respective sense-amplifier blocks make it possible to reduce the load on sense-amplifier driving signals used in the row-access operations. This increases signal switching speed, and achieves control of the sense-amplifier driving signals at such a high speed as to be in commensurate with a reduction in time intervals between the row accesses.

Furthermore, according to the present invention, the semiconductor memory device further includes a plurality of banks, each of which includes the memory cells, the sense amplifiers, and the bit lines, wherein the sense amplifiers are grouped into the plurality of sense-amplifier blocks in each of the plurality of banks. In this manner, the semiconductor memory device of the present invention may be implemented as having a multiple-bank structure.

Also, according to the present invention, the semiconductor memory further includes bit-line-transfer-signal generation units each provided for a corresponding set of more than one sense-amplifier block. This configuration can reduce a chip size of the semiconductor memory device in comparison to when each sense-amplifier block is provided with a corresponding bit-line-transfer-signal generation unit.

Further, according to the present invention, a series of operations including emergence of the data of the memory cells on the bit lines, amplification of the data by the sense amplifiers, and a reset of the bit lines and the sense amplifiers is continuously repeated at constant cycles without any intervening break period. Therefore, a pipe-line operation is performed based on a configuration that is appropriate for row-access pipe-line operations. This makes it possible to conduct consecutive row-access operations at such a high speed as may be close to performance limits of the sense amplifiers.

Moreover, according to the present invention, a direct-sense-amplifier circuit is provided so as to be used in transferring the data from the sense amplifiers to a data bus via column gates. This configuration eliminates fluctuation of a bit-line voltage level at a time of read operations. Therefore, it is possible to bring forward the timing of a bit-line precharge and to make operation cycles shorter.

Furthermore, according to the present invention, a row-access command and a column-access command are received at the same timing defined by an externally supplied clock signal. Because of this, a time period from the row-access command to outputting of data can be kept constant even when the clock signal is lowered of its frequency.

BRIEF DESCRIPTION OF THE DRAWINGS

FIG. 4 is an illustrative drawing diagrammatically showing operations of the DRAM according to the present invention.

FIGS. 5A through 5C are illustrative drawings showing relations between a sense-amplifier-operation cycle and an interval tRC representing intervals between activation commands ACT.

FIGS. 18A through 18C are drawings showing the way a selector circuit and a selector-switch circuit are selected when a burst length is 1, 2, and 4, respectively.

FIG. 30 is a block diagram showing another configuration of a DRAM according to the present invention.

FIG. 32 is a table showing a status of each switch with respect to a case in which the burst length is 1, 2, or 4.

FIGS. 35A and 35B are tables showing operation conditions of four control-clock signals and two output-control-clock signals with respect to cases in which the burst length is 1, 2, and 4.

DESCRIPTION OF THE PREFERRED EMBODIMENTS

In the following, embodiments of the present invention will be described with reference to the accompanying drawings.

Figure 3:
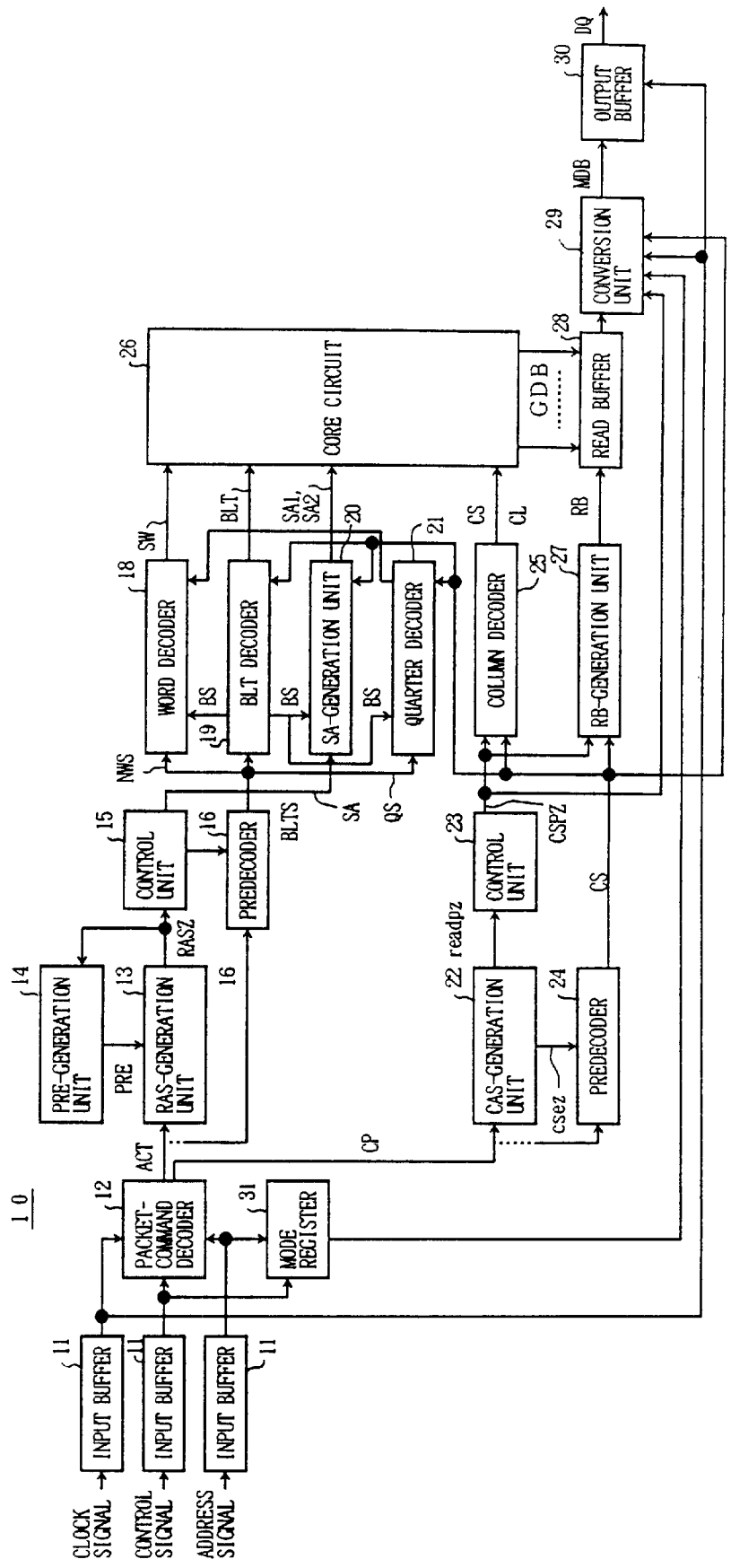
FIG. 3 is a block diagram of a DRAM according to the present invention.

FIG. 3 is a block diagram of a DRAM according to the present invention. A DRAM 10 of FIG. 3 includes a plurality of input buffers 11, a packet-command decoder 12, a RAS-generation unit 13, a PRE-generation unit 14, a control unit 15, a pre-decoder 16, a word decoder 18, a BLT decoder 19, an SA-generation unit 20, a quarter decoder 21, a CAS-generation unit 22, a control unit 23, a pre-decoder 24, a column decoder 25, a core circuit 26, an RB-generation unit 27, a read buffer 28, a conversion unit 29, an output buffer 30, and a mode register 31.

Data-read operations of the DRAM 10 of FIG. 3 will be described first with respect to basic operations which are the same as those of conventional DRAMs.

A clock signal, control signals, and address signals are input to the input buffers 11 from an external source provided outside the DRAM 10. The clock signal is supplied to various elements of the DRAM 10 to control operations of the DRAM 10 in synchronism. The control signals are decoded by the packet-command decoder 12, and control the RAS-generation unit 13 and the CAS-generation unit 22 according to the decoding results. The address signals are supplied to the pre-decoder 16 of the row-address system and to the pre-decoder 24 of the column-address system.

The RAS-generation unit 13 generates a signal RASZ, which is an internal RAS signal, when an activation command ACT corresponding to a conventional /RAS signal is input as a control signal. The RAS-generation unit 13 generates a plurality of signals RASZ successively inside the DRAM 10 when a refresh command is input, thereby activating refresh operations. When the activation command ACT is input, the signal RASZ is generated only once. The signal RASZ, which prompts operations for reading data from memory cells to sense amplifiers, is supplied to the control unit 15. Upon receiving the signal RASZ, the control unit 15 controls the SA-generation unit 20 to generate sense-amplifier driving signals SA1 and SA2 at appropriate respective timings. Here, the quarter decoder 21 is used in a conventional hierarchical word-decode scheme, and selects one sub-word decoder from four sub-word decoders dependent on a selected main-word decoder.

The pre-decoder 16 of the row-address system latches and pre-decodes a supplied row address. Pre-decoding results are supplied to the word decoder 18, the BLT decoder 19, and the quarter decoder 21. The pre-decoder 16 includes a block decoder 17, and selects one of a plurality of memory blocks provided inside the DRAM 10. Only in the selected memory block, do the word decoder 18, the BLT decoder 19, the SA-generation unit 20, and the quarter decoder 21 operate to read data from memory cells and store the data in sense amplifiers in the core circuit 26.

Figure 1:
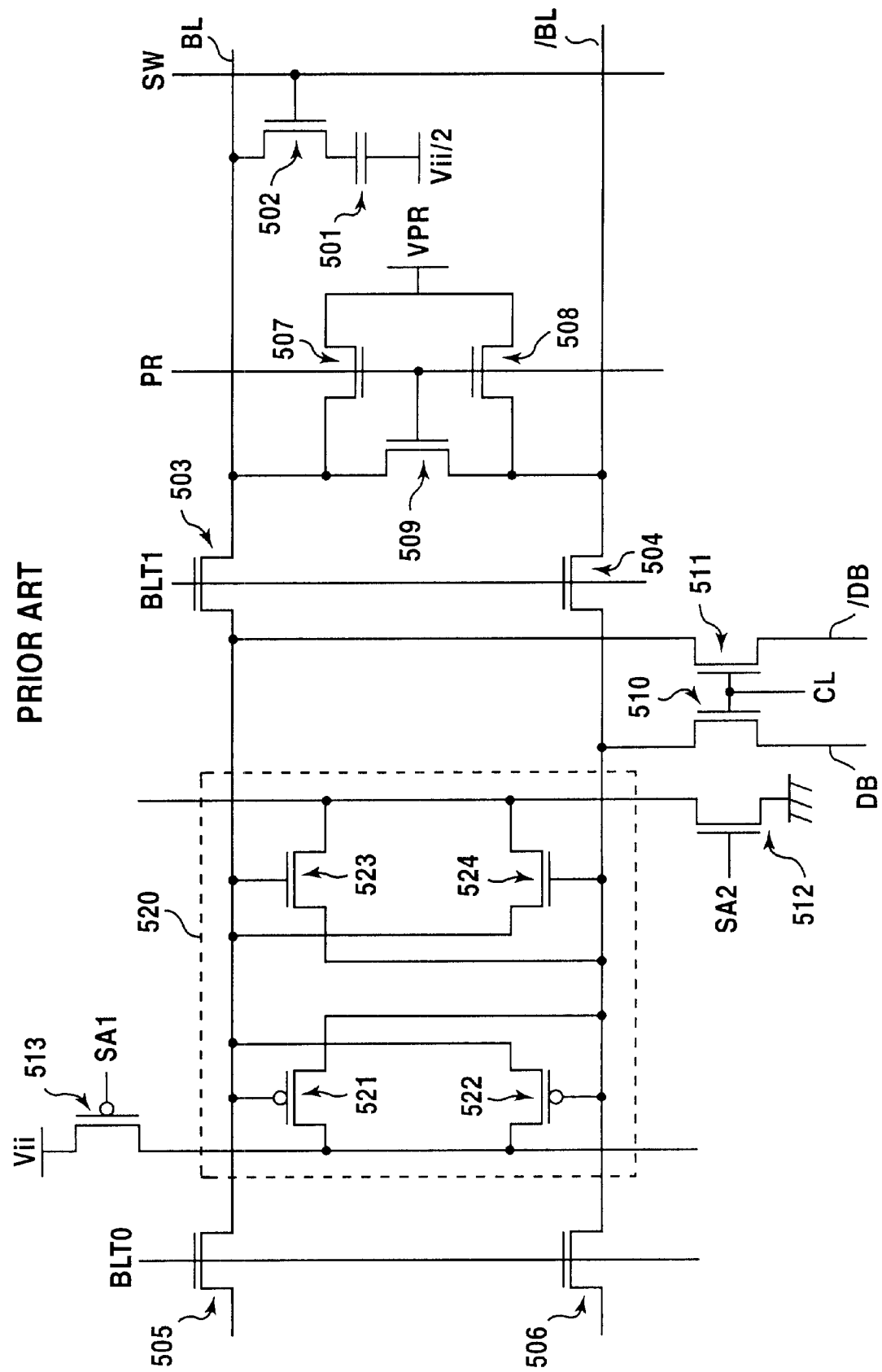
FIG. 1 is a circuit diagram showing a portion of a conventional DRAM with regard to peripherals of memory cells.

The core circuit 26 includes memory cells identical to the memory cell 501 of FIG. 1 arranged in an array structure having rows and columns, and a sense amplifier identical to the sense amplifier 520 of FIG. 1 is provided for each column. After the row-address-read operations as described above, the data of memory cells corresponding to a word line selected by the row address is stored in the sense amplifiers.

The CAS-generation unit 22 generates an internal CAS signal when a read command RD corresponding to a conventional /CAS signal is input as a control signal. The internal CAS signal, which prompts operations to read data of the sense amplifiers from the core circuit 26 to the read buffer 28, is supplied to the control unit 23. Upon receiving the internal CAS signal, the control unit 23 controls the column decoder 25 to generate a column-line selecting signal CL at an appropriate timing.

The pre-decoder 24 of the column-address system latches and pre-decodes the supplied column address. The pre-decoding results are supplied to the column decoder 25, and, also, are provided to the RB-generation unit 27. The column decoder 25 supplies the column-line selecting signal CL to a column indicated by the column address, and reads data from a sense amplifier of this column to the read buffer 28. The RB-generation unit 27 supplies a signal RB to the read buffer 28 at an appropriate timing so as to make the read buffer 28 read the data.

The read buffer 28 amplifies an amplitude of the supplied data signal, and the amplified data is sent out of the DRAM 10 via the output buffer 30.

In addition to the above-described basic operations, the DRAM 10 of the present invention achieves row-access pipe-line operations based on the packet-command decoder 12, the PRE-generation unit 14, and the conversion unit 29.

The PRE-generation unit 14, upon receiving the signal RASZ serving as an internal RAS signal, generates a precharge signal PRE after the passage of a predetermined time period. The precharge signal PRE, which is internally generated, resets the RAS-generation unit 13 to perform precharge operations in the same manner as when the precharge signal PRE is externally provided. Hereinafter, the precharge operations initiated by the internally generated precharge signal PRE is referred to as self-precharge operations.

Further, when data is read from the core circuit 26, data of consecutive column addresses is simultaneously read from sense amplifiers as parallel data. The parallel data is supplied to the conversion unit 29 via the read buffer 28. The conversion unit 29 converts the parallel data into serial data, and supplies a predetermined number of data pieces as serial data to the output buffer 30 in accordance with a burst length set in the mode register 31.

In the DRAM of the present invention shown in FIG. 3, the data of the sense amplifiers is read in parallel. Because of this, when a series of operations from the row-address input to the data output is divided into the command-decode and peripheral-circuit operations of a first step, the sense-amplifier operations of a second step, and the data-output operations of a third step, the sense-amplifier operations of the second step have a constant operation period irrespective of a specified burst length. As is obvious, data of the sense amplifiers needs to be read out by opening a column gate of a selected column while the sense amplifiers are open (active). In conventional DRAMs, however, column gates are successively open with respect to consecutive column addresses, so that the active period of the sense amplifiers are bound to be dependent on the burst length. In the present invention, on the other hand, data of the sense amplifiers is read in parallel by simultaneously opening a plurality of column gates, and selection of output data based on the burst length is made by the conversion unit 29. This makes it possible for the sense amplifiers to operate only for a constant time period. Because of this, the operation period of the sense-amplifier operations of the second step becomes constant regardless of a specified burst length.

Further, since the operation period of the sense-amplifier operations of the second step is now constant, there is no need for a user to provide the precharge command to the DRAM 10 from an external source. This makes it possible to perform self-precharge operations at an appropriate timing based on the automatically generated internal precharge signal PRE. This internal precharge signal PRE may be obtained by delaying the internal-RAS signal RASZ by a constant time length irrespective of the burst length or the like. If it is incumbent upon the user to determine the precharge timing from outside the DRAM 10, the arbitrary nature of the precharge timing works as one of the causes to disturb the pipe-line operations. In the present invention, however, such a cause is eliminated. Further, the precharge operation can be conducted at an optimum timing immediately after the data is read from the sense amplifiers by the column-line selecting signals CL. This achieves high-speed data-read operations having a high performance limited only by the capacity of sense-amplifier operations.

FIG. 4 is an illustrative drawing diagrammatically showing operations of the DRAM according to the present invention. With reference to FIG. 4, the row-access pipe-line operations of the DRAM of the present invention will be described further in detail.

As shown in FIG. 4, upon receiving a command (activation command ACT), the DRAM of the present invention first performs, during a first cycle (at the first step), the command-decode operations and the peripheral-circuit operations relating to row access but excluding the sense-amplifier operations. During a second cycle, then, the sense-amplifier operations are conducted. Namely, the second cycle includes conveying cell data to bit lines through a word-line selection, amplifying data on the bit lines by sense amplifiers, reading the data of the bit lines to the data bus through a column-line selection, and resetting relevant circuits such as precharging the bit lines. After this, during a third cycle, the data-output operations are performed. Namely, during the third cycle, the parallel data is converted to serial data, which is then output from the output buffer. In the DRAM of the present invention, as shown in FIG. 4, these three cycles are overlaid to be carried out in a pipe-line manner.

Conventional configurations of DRAMs read data from sense amplifiers by activating a column-line selecting signal CL once or by successively activating a column-line selecting signal CL more than once according to the specified burst length, and perform reset operations based on an input precharge command after the data is read. In such conventional configurations, the burst length is subject to a change in accordance to user settings. The user thus has to input a precharge command to initiate the precharge operations after the data is read by activating the column-line selecting signal CL once or more than once. This means that the activation period of the sense amplifiers varies depending on the burst length, so that the period of sense-amplifier operation in FIG. 4 may become shorter or longer as the condition varies. In such configurations, it is extremely difficult to implement pipe-line operations by inputting the activation command ACT at the start timing of the sense-amplifier operations. Even if such pipe-line operations are implemented, a control system would become extremely complicated.

On the other hand, the DRAM of the present invention is designed such that a plurality of column lines irrespective of the burst length are simultaneously selected to read the parallel data, and the parallel data is then selected on a bit-wise basis in accordance with the burst length to be converted into serial data before being output from the DRAM. This configuration allows the DRAM to have a constant length of the second cycle during which the sense amplifiers are in operation. As a result, the reset operations are performed at a fixed timing based on the self-precharge features, and there is no need to input a precharge command from outside. Since the precharge command is no longer necessary to be provided from outside, the input timing of the activation command ACT can be brought forward with regard to time. Further, since the cycle of the sense-amplifier operations has a constant time span, the pipe-line operations overlaying the first through third cycles can be easily controlled.

In the pipe-line operations described above, as can be seen in FIG. 4, an internal tRC representing intervals between commands (activation commands ACT) can be greatly reduced compared to when the conventional configurations are used without pipe-line operations. The internal tRC is determined by a duration of the cycle of the sense-amplifier operations as shown in FIG. 4. This is because the second cycle is the longest of all the first, second, and third cycles shown in FIG. 4. When the longest second cycle is continuously repeated without any break as shown in FIG. 4, a rate at which data is read becomes maximum, and the time period of the second cycle is equal to rRC.

FIGS. 5A through 5C are illustrative drawings showing relations between the sense-amplifier-operation cycle and the interval tRC representing intervals between the activation commands ACT.

As shown in FIG. 5A, intervals between the activation commands ACT are defined as the interval tRC. As shown in FIG. 5B, the sense-amplifier cycle (the cycle of the sense-amplifier operations) can be divided into a word-line-selection cycle, a sense-amplifier-activation cycle, and a reset cycle. As shown in FIG. 5C, during the word-line-selection cycle, the sub-word-line selecting signal SW is changed to HIGH, so that cell data appears on the bit-lines BL and /BL. During the sense-amplifier-activation cycle, the sense-amplifier driving signals SA1 and SA2 are activated to drive the sense amplifiers, thereby amplifying the data of the bit-lines BL and /BL. Also during the sense-amplifier-activation cycle, the column-line selecting signal CL is changed to HIGH after the data of the bit-lines BL and /BL is sufficiently amplified, so that the data on the bit-lines BL and /BL is read to the data bus. Then, during the reset cycle, the sub-word-line selecting signal SW is reset, and the precharge signal PR is changed to HIGH to precharge the bit-lines BL and /BL. By this time, the sense-amplifier driving signals SA1 and SA2 have been already deactivated.

As can be seen from FIGS. 5A and 5B, when the activation commands ACT are successively input at the intervals tRC, the sense-amplifier cycle is consecutively performed without any intervening break. Because of this, the interval tRC representing intervals between the activation commands ACT is determined by the duration of the sense-amplifier cycle, which includes the word-line-selection cycle, the sense-amplifier-activation cycle, and the reset cycle. In the configuration of the present invention, therefore, if a reduction in the length of the sense-amplifier cycle is made by speeding up each operation of the sense-amplifier cycle, the interval tRC can also be reduced, thereby increasing a data-read-operation speed of the DRAM.

In FIG. 4, an illustration is provided such that the third cycle (data output) appears to start after the second cycle (sense-amplifier operation) is completed. A closer inspection reveals that the third cycle can be started immediately after the column-selection signal CL is turned to HIGH as shown in FIG. 5B and 5C. In such a case, the data-output operation and the bit-line-precharge operation are performed in parallel.

Figure 6:
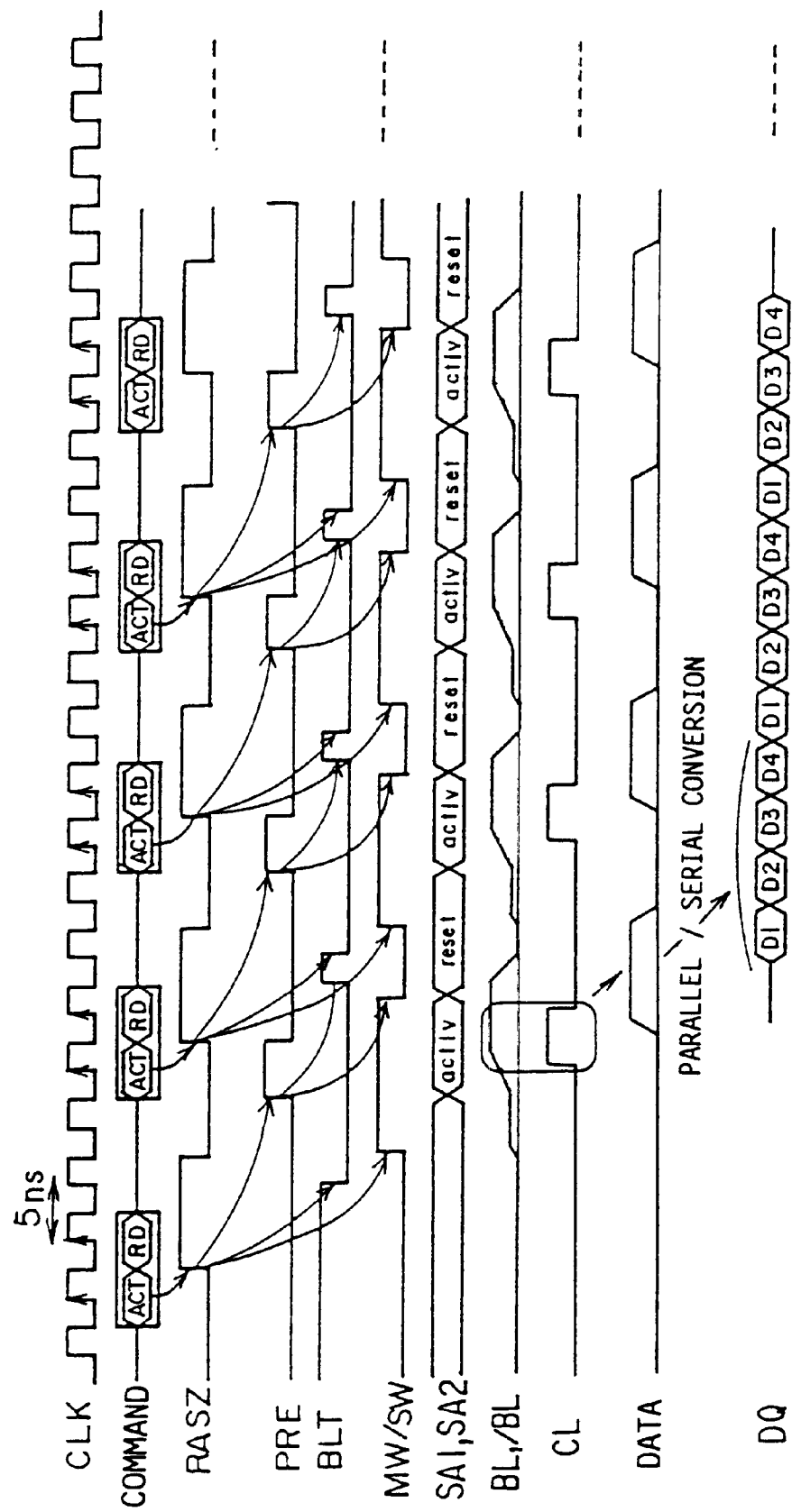
FIG. 6 is timing charts for explaining enhancement of row-access speed based on self-precharge operations.

FIG. 6 is timing charts for explaining the enhancement of row-access speed based on the self-precharge operations. As described above, the present invention performs the self-precharge operations at an optimum timing through the internal precharge signal PRE, thereby achieving high-speed row-access operations. With reference to FIG. 3 and FIG. 6, timings of the row-access operations in the DRAM 10 will be described below.

Upon input of the activation command ACT, the RAS-generation unit 13 generates the signal RASZ. The signal RASZ is supplied to the control unit 15, which in turn controls the word decoder 18, the BLT decoder 19, the SA-generation unit 20, and the quarter decoder 21 to generate the word-line selecting signals MW and SW, the bit-line-transfer signal BLT, and the sense-amplifier driving signals SA1 and SA2 at appropriate respective timings. Based on these signals, data of the memory cell 501 (see FIG. 1) is stored in the sense amplifier 520. This operation corresponds to developments shown in FIG. 6, where data appears on the bit-lines BL and /BL, and an amplitude of the data is amplified.

The signal RASZ is also supplied to the PRE-generation unit 14. The PRE-generation unit 14 generates the internal precharge signal PRE at an end of a predetermined time period after receiving the signal RASZ.

Further, responding to the read command RD, the CAS-generation unit 22, the control unit 23, the pre-decoder 24, and the column decoder 25 start operating. Operations of these circuits change the column-line selecting signal CL to HIGH with respect to a column selected by the column address, so that the data of the sense amplifier 520 (see FIG. 1) is read to the global data bus GDB (FIG. 3) via the data bus DB and /DB (see FIG. 1).

The read buffer 28 reads the data on the global data bus GDB, and amplifies the data. The data stored in the read buffer 28 is actually parallel data, and the conversion unit 29 converts the parallel data to serial data by performing parallel-to-serial conversion. The serial data is then output from the DRAM 10 via the output buffer 30.

As shown in FIG. 6, the internally generated precharge signal PRE resets the bit-line-transfer signal BLT and the word-line selecting signals MW and SW, and precharges the bit-lines BL and /BL to a predetermined voltage level in a similar manner to conventional DRAMs where the precharge signal is provided from outside. The precharge operations by the precharge signal PRE is conducted, as shown in FIG. 6, immediately after the data is read from the sense amplifier(s) by use of the column-line selecting signal CL. In the conventional timings shown in FIG. 2, on the other hand, there is a wasting time with regard to data-read operations between an end of a data-read operation by the column-line selecting signal CL and a start of a precharge operation responding to an externally provided precharge command.

In the present invention, the precharge signal PRE is internally generated based on a timing of the activation command ACT, so that the precharge operation can be performed immediately after the data-read operation by the column-line selecting signal CL. The present invention keeps the activation period of the sense amplifiers constant irrespective of the burst length, which makes it easy to generate the precharge signal PRE. Namely, this signal can be obtained simply by introducing a constant delay to the internal-RAS signal (RASZ). A length of this constant delay may be determined by taking into account a time period for selecting and activating a word line in response to the internal-RAS signal, a time period for amplifying bit-line voltages up to a sufficient level by use of the sense amplifiers, and a time period for transferring the data appearing on the bit lines to the data bus by opening the column gates. When there is a need to read data from different row addresses, therefore, a waiting time before reading data from a new row address can be significantly reduced.

Even after the data is read by the column-line selecting signal CL, if the sub-word lines are closed before the completion of data amplification by the sense amplifiers, the data of the sense amplifiers is not restored in the memory cells, and, thus, is destroyed. Because of this, the precharge operation should not be performed until the data amplification by the sense amplifiers is completed. This is the same requirement as that of a conventional DRAM. In the present invention, a time period for the sense-amplifier cycle prior to the reset cycle is thus dependent on the signal driving capacity of the sense amplifiers.

Figure 2:
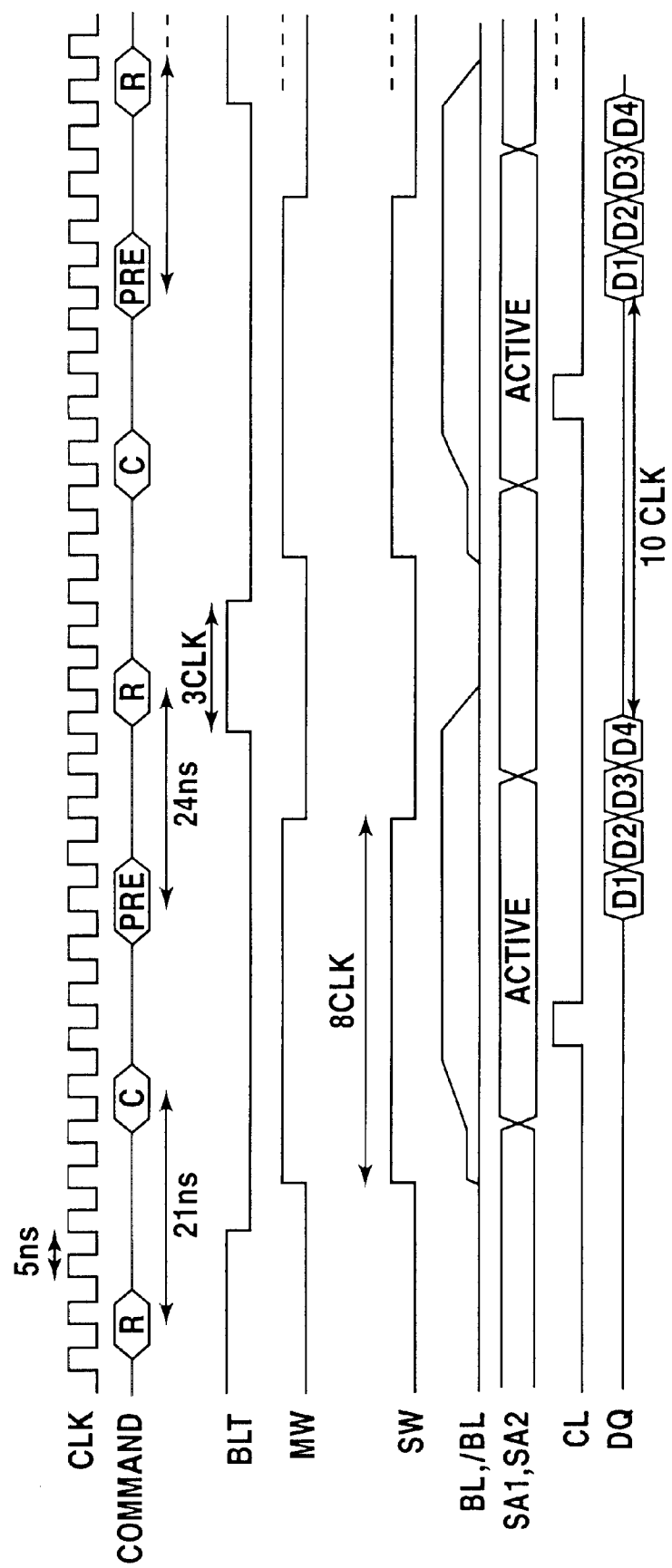
FIG. 2 is timing charts for explaining data-read operations of the conventional DRAM.

In FIG. 6, further, the active command ACT and the read command RD are acquired at two successive clock cycles. This makes it possible to obtain the column address at an earlier timing than otherwise since the column address accompanies the read command RD. As a result, the column gates are opened at an earlier timing. As will be discussed later, the column address is also used for dividing the sense amplifiers into blocks. Since the column address is acquired at an earlier timing in the present invention, a selective activation of a sense-amplifier block can be started earlier than otherwise. In the related art as shown in FIG. 2, a predetermined time period (21 ns in FIG. 2) is provided as a gap between the active command and the read command. The purpose of this gap is to open the column gates after the bit-line voltages are sufficiently amplified by the sense amplifiers. In the present invention, such timing control is effected by the control units 15 and 23.

Further, the data is read from the core circuit 26 in parallel, and the conversion unit 29 carries out a parallel-to-serial conversion. This achieves continuous data-read operations as shown in FIG. 6. At the time of this parallel-to-serial conversion, data selection based on the burst-length information is also carried out.

As previously described, in the DRAM 10 of the present invention, commands are provided in a packet format to reduce intervals between the commands. As shown in FIG. 6, the activation command ACT and the read command RD are input to the DRAM 10 as one packet extending over two cycles. The user thus does not have to be concerned about keeping an input interval between the activation command ACT and the read command RD while such an input interval is required in the related art shown in FIG. 2. The received packet command is decoded by the packet-command decoder 12. Based on the decoding results, signals of the RAS system are supplied from the packet-command decoder 12 to the RAS-generation unit 13 and the pre-decoder 16, and signals of the CAS system are supplied from the packet-command decoder 12 to the CAS-generation unit 22 and the pre-decoder 24.

When the intervals between row accesses are shortened, further, changes in signal levels need to be made faster with respect to the sub-word-line selecting signal SW, the bit-line-transfer signal BLT, and the sense-amplifier driving signals SA1 and SA2 as can be understood from a comparison of FIG. 6 with FIG. 2. If changes in the signal levels are slow, a sufficient reduction in the intervals cannot be made. The DRAM 10 of the present invention thus divides a series of sense amplifiers into a plurality of sense-amplifier blocks. Then, the sense-amplifier driving signals SA1 and SA2 are supplied only to sense amplifiers of a selected sense-amplifier block, and, also, the word-line selecting signal SW and the bit-line-transfer signal BLT are supplied only to memory blocks of the selected sense-amplifier block. This configuration reduces the load on these signals, thereby speeding up the changes in the signal levels.

The above-identified signals are those which are driven during the row-access operations. In order to selectively activate one of the sense-amplifier blocks, a column address signal is also necessary. In the conventional timings shown in FIG. 2, however, a column address is not yet received when the row access is engaged. This makes it impossible to select a particular column address and to activate a sense amplifier corresponding to this column address. In the present invention, on the other hand, the activation command ACT and the read command RD are received as one packet, so that a column address can be identified at the time of row access. This allows a row-access operation to be performed only with respect to a single sense-amplifier block after selecting this sense-amplifier block corresponding to the indicated column address.

In the following, a configuration of each element of the DRAM 10 shown in FIG. 3 will be described. The same elements as those of conventional configurations, however, will be omitted from the following descriptions.

Figure 7:
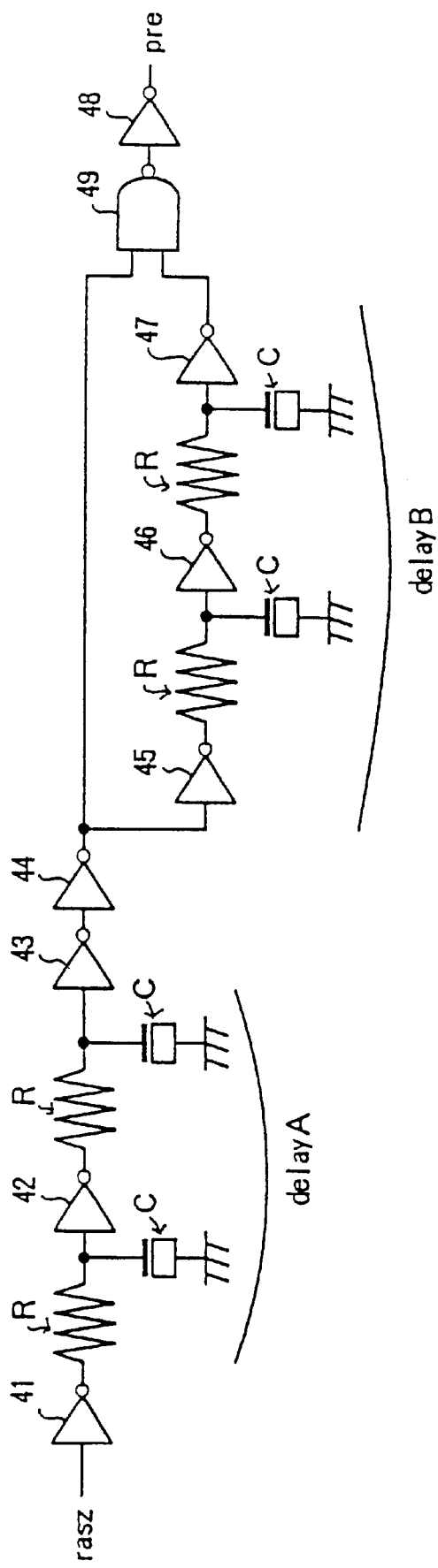
FIG. 7 is a circuit diagram of a PRE-generation unit shown in FIG. 3.

FIG. 7 is a circuit diagram of the PRE-generation unit 14 shown in FIG. 3.

The PRE-generation unit 14 includes inverters 41 through 48, a NAND circuit 49, a plurality of resistors R, and a plurality of capacitors C. The inverters 41 through 44, some of the plurality of resistors R, and some of the plurality of capacitors C together form a first series of delay elements (delay A). The inverters 45 through 47, the remaining ones of the plurality of resistors R, and the remaining ones of the plurality of capacitors C together make up a second series of delay elements (delay B). The first series of delay elements receives the signal RASZ which is a HIGH-pulse signal, so that the signal PRE becomes HIGH after a first delay time. The delayed signal RASZ is further delayed by a second delay time as the delayed signal RASZ passes through the second series of delay elements, resulting a change to LOW in the signal PRE. That is, a timing of a rising edge of the precharge signal PRE is determined by the first delay time introduced by the first series of delay elements, and a duration of a HIGH period of the precharge signal PRE is defined by the second delay time imposed by the second series of delay elements. The first delay time is constant regardless of the burst length. As previously described, the present invention has an activation period of the sense amplifiers that is constant irrespective of the burst length in each read-opration cycle. Because of this, the precharge-signal-PRE generation circuit can be implemented by using a quite simple structure.

Use of the PRE-generation unit 14 having a configuration described above makes it possible to generate the internal precharge signal PRE at an end of a predetermined time period after the RAS-generation unit 13 generates the signal RASZ.

Figure 8:
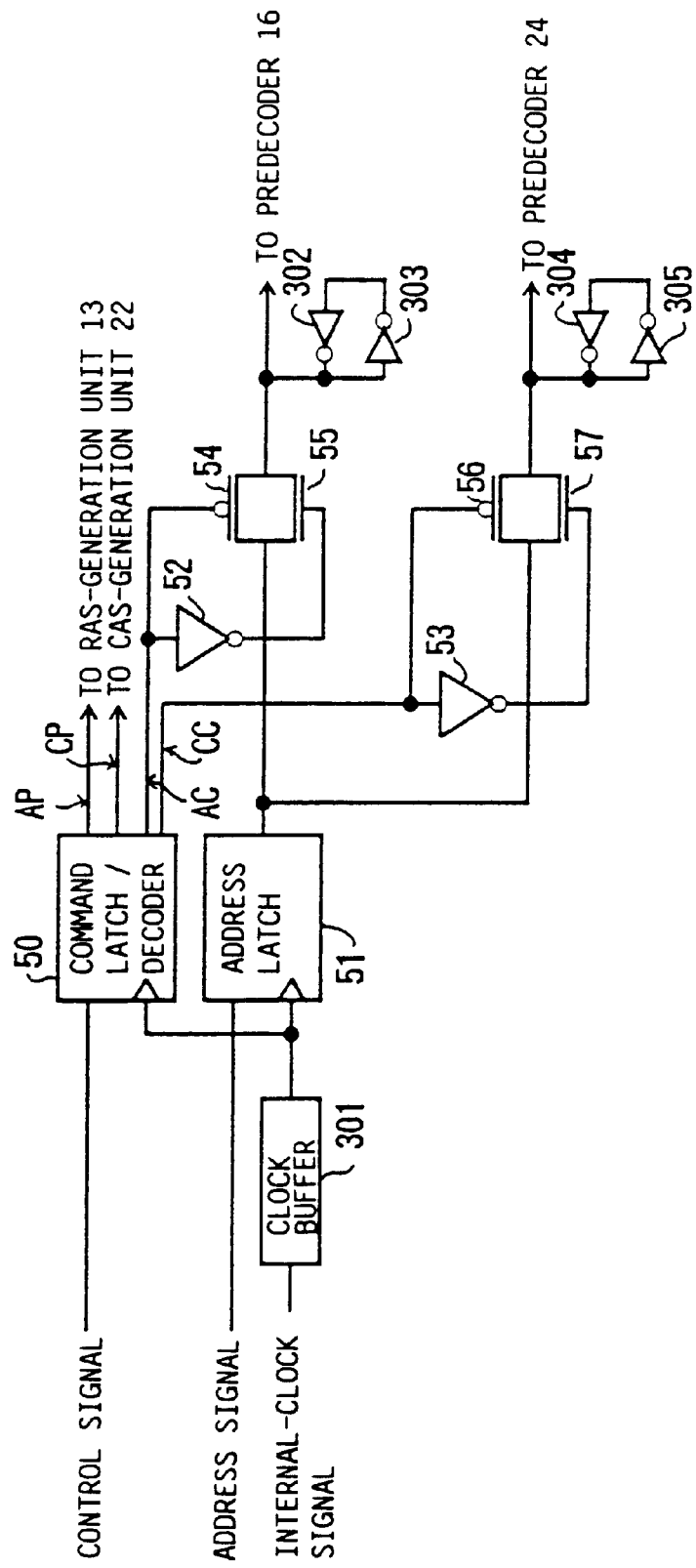
FIG. 8 is a block diagram of a packet-command decoder shown FIG. 3.

FIG. 8 is a block diagram of the packet-command decoder 12 shown in FIG. 3.

The packet-command decoder 12 of FIG. 8 includes a command-latch decoder 50, an address latch 51, inverters 52 and 53, a PMOS transistor 54, a NMOS transistor 55, a PMOS transistor 56, a NMOS transistor 57, a clock buffer 301, and inverters 302 through 305.

Figure 9:
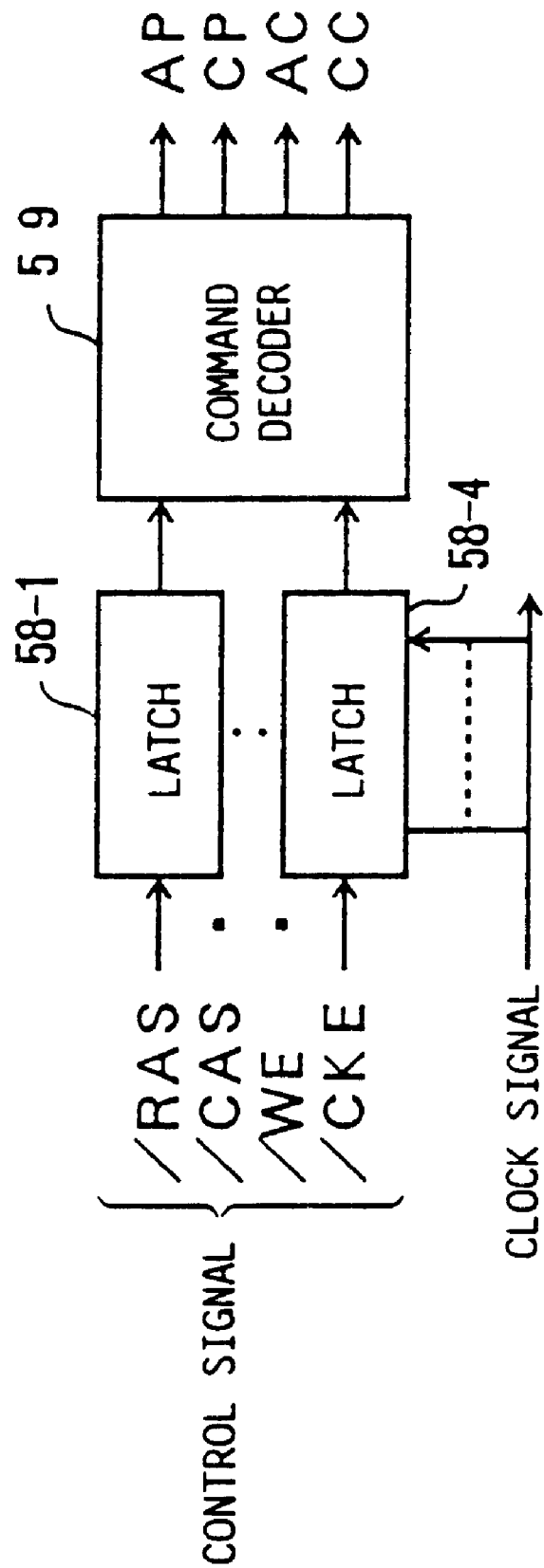
FIG. 9 is a block diagram of a command-latch decoder shown in FIG. 8.

FIG. 9 is a block diagram of the command-latch decoder 50 shown in FIG. 8.

As shown in FIG. 9, the command-latch decoder 50 includes four latches 58-1 through 58-4 and a command decoder 59.

Figure 10:
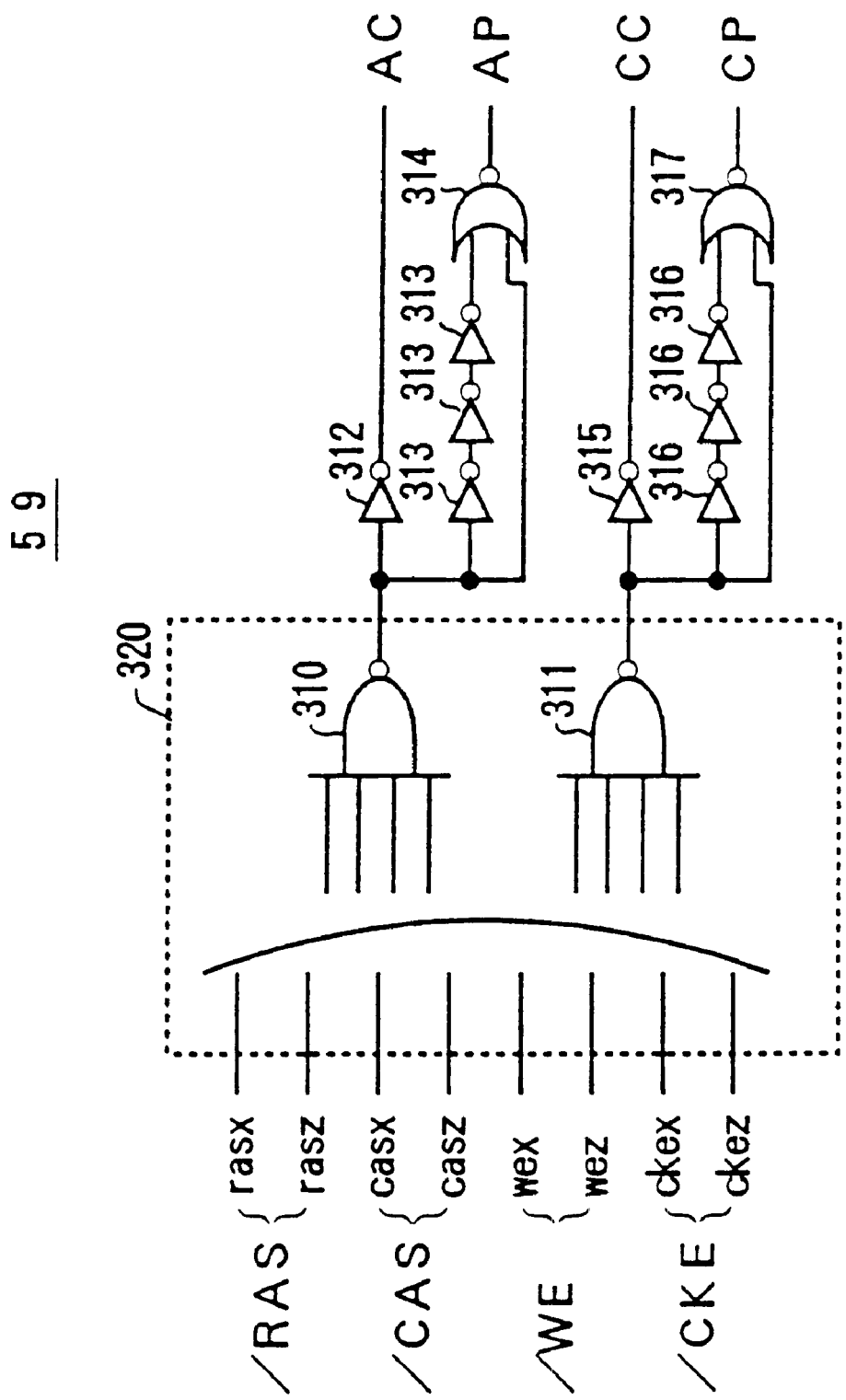
FIG. 10 is a circuit diagram of a command decoder shown in FIG. 9.

FIG. 10 is a circuit diagram of the command decoder 59 shown in FIG. 9.

The command decoder 59 of FIG. 10 includes a decoder unit 320 comprised of NAND circuits 310 and 311, an inverter 312, a plurality of inverters 313, a NOR circuit 314, an inverter 315, a plurality of inverters 316, and a NOR circuit 317.

In FIG. 9, the latches 58-1 through 58-4 of the command-latch decoder 50 latch the control signals /RAS, /CAS, /WE, and /CKE, respectively, in synchronism with the clock signal. A combination of these control signals indicates the activation command ACT, the read command RD, etc. Each of the latches 58-1 through 58-4 latches the respective control signal, and outputs a signal having positive logic and a signal having a negative logic. With respect to the /RAS signal, for example, a signal rasx and a signal rasz are output.

As shown in FIG. 10, the decoder unit 320 of the command decoder 59 decodes the control signals by supplying various combinations of the positive-logic signals and the negative-logic signals corresponding to the control signals /RAS, /CAS, /WE, and /CKE to input nodes of the NAND circuits 310 and 311. As decoding results, the NAND circuit 310 generates an internal activation signal, and the NAND circuit 311 generates an internal read signal in the example of FIG. 10. In the decoder unit 320, actual combinations of input signals supplied to the NAND circuits 310 and 311 are a matter of design choice since such combinations are dependent on which combinations of the control signals correspond to the internal activation signal and the internal read signal. FIG. 10 thus omits details of a wiring layout.

As shown in FIG. 10, two pulse signals AC and AP are generated in response to the activation command ACT, and these two pulse signals have different pulse widths. An active-cycle signal AC is in synchronism with the input signal (rasx, rasz, . . . ), which are maintained for a duration of one clock cycle by the latches 58-1 through 58-4, as will be described later. The active-cycle signal AC thus has a pulse width equal to the duration of the one clock cycle. An active-pulse signal AP has a rising-edge timing in synchronism with the input signals, and has a falling-edge timing which is controlled by the number of delay stages comprised of the inverters 313. In the same manner, two pulse signals CC and CP are generated in response to the read command RD, and these two pulse signals have different pulse widths. A column-access-cycle signal CC has a pulse width equal to one clock cycle. A column-access-pulse signal CP has a rising-edge timing in synchronism with the input signals, and has a falling-edge timing which is controlled by the number of delay stages comprised of the inverters 316.

Figure 11:
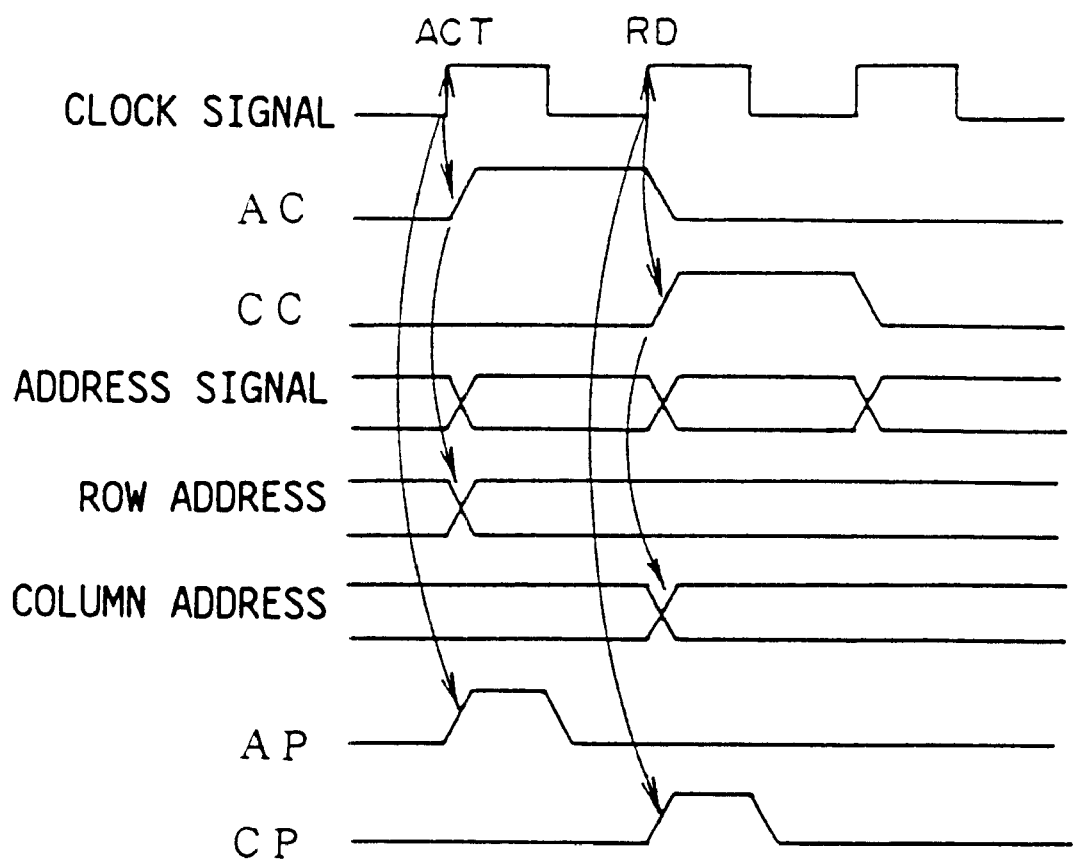
FIG. 11 is timing charts showing operations of the packet-command decoder of FIG. 8.

FIG. 11 is timing charts showing operations of the packet-command decoder 12 of FIG. 8. With reference to FIG. 8 and FIG. 11, operations of the packet-command decoder 12 will be described below.

Since the activation command ACT and the read command RD are received as a single packet extending over two consecutive cycles, the activation command ACT is latched at the first cycle, and the read command RD is latched at the second cycle. The latched commands are then decoded by the command-latch decoder 50 as described in the above. The command-latch decoder 50 generates the active-pulse signal AP and the active-cycle signal AC at predetermined timings in response to the activation command ACT as described above. The active-pulse signal AP is supplied to the RAS-generation unit 13, and the active-cycle signal AC opens a gate comprised of the PMOS transistor 54 and the NMOS transistor 55.

The command decoder 59 generates the column-access-pulse signal CP and the column-access-cycle signal CC at predetermined timings in response to the read command RD as described above. The column-access-pulse signal CP is supplied to the CAS-generation unit 22, and the column-access-cycle signal CC opens a gate comprised of the PMOS transistor 56 and the NMOS transistor 57.

The address latch 51 latches the address signals in synchronism with the clock signal. The latched row address is supplied to the pre-decoder 16 of the row-address system at a timing indicated by the active-cycle signal AC. While this operation is conducted, a latch comprised of inverters 302 and 303 holds the row address. Also, the latched column address is supplied to the pre-decoder 24 of the column-address system at a timing indicated by the column-access-cycle signal CC. While this operation is performed, a latch comprised of inverters 304 and 305 holds the row address.

Use of the packet-command decoder 12 as described above makes it possible to distribute the RAS-system signals and the CAS-system signals to their respective paths when the activation command ACT and the read command RD are provided as a packet extending over two consecutive cycles.

Figure 12A:
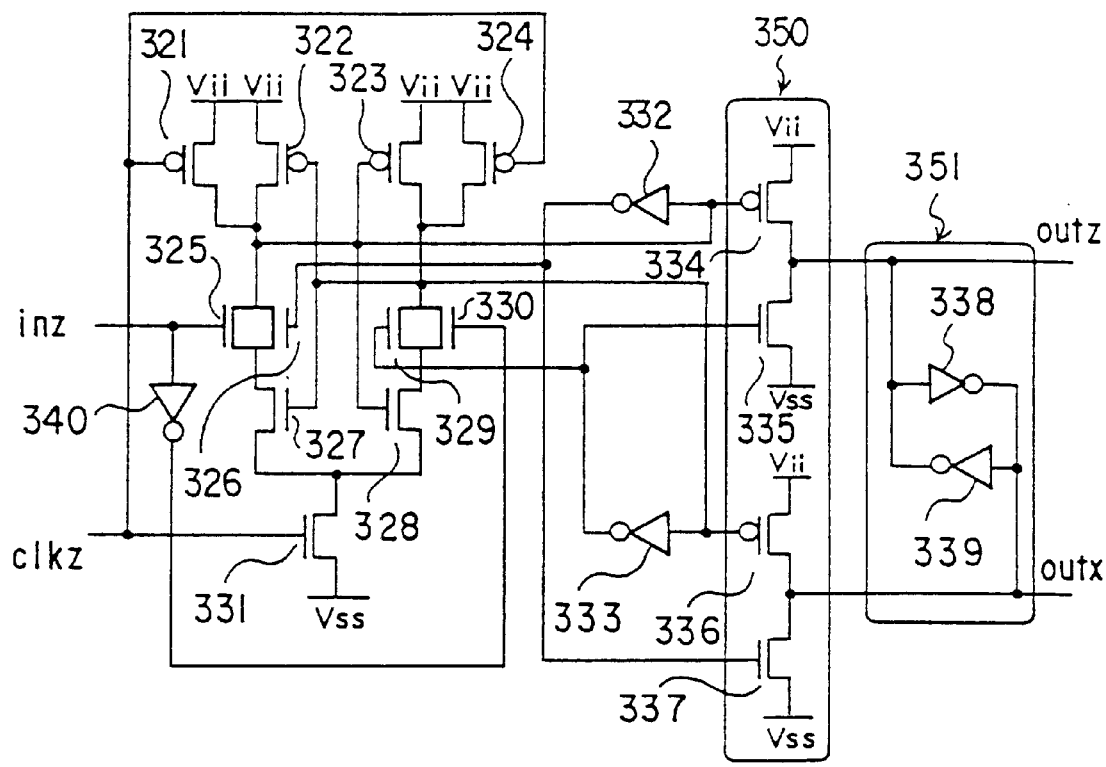
FIG. 12A is a circuit diagram of a latch shown in FIG. 9.
Figure 12B:
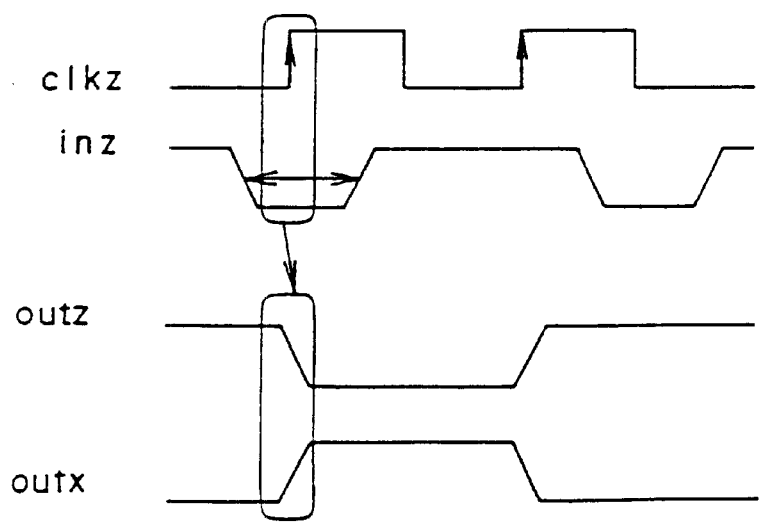
FIG. 12B is a timing chart showing operations of the latch of FIG. 12A.

FIG. 12A is a circuit diagram of any one of the latches 58-1 through 58-4 shown in FIG. 9. FIG. 12B is a timing chart showing operations of the latch of FIG. 12A.

The latch of FIG. 12A includes PMOS transistors 321 through 324, NMOS transistors 325 through 331, inverters 332 and 333, PMOS transistor 334, NMOS transistor 335, PMOS transistor 336, NMOS transistor 337, and inverters 338 through 340. The PMOS transistor 334, NMOS transistor 335, the PMOS transistor 336, and the NMOS transistor 337 together form a tri-state buffer 350. Further, the inverters 338 and 339 together make up an output latch 351.

The latch of FIG. 12A reads an input signal inz in synchronism with a rising edge of the clock signal clkz. Depending on signal levels of the input signal inz, the tri-state buffer 350 is controlled to output an output signal outz and an output signal outx. When the clock signal clkz falls, the tri-state buffer 350 is put in a Hi-Z-output state. When this happens, the data of the input signal inz, which is read in synchronism with the rising edge timing, is held by the output latch 351. The data of the output latch 351 continues to be held until new data is read in synchronism with a next rising edge of the clock signal clkz.

In this manner, the latch of FIG. 12A generates the output signals outz and outx having an active period equal to one clock cycle.

Figure 13:
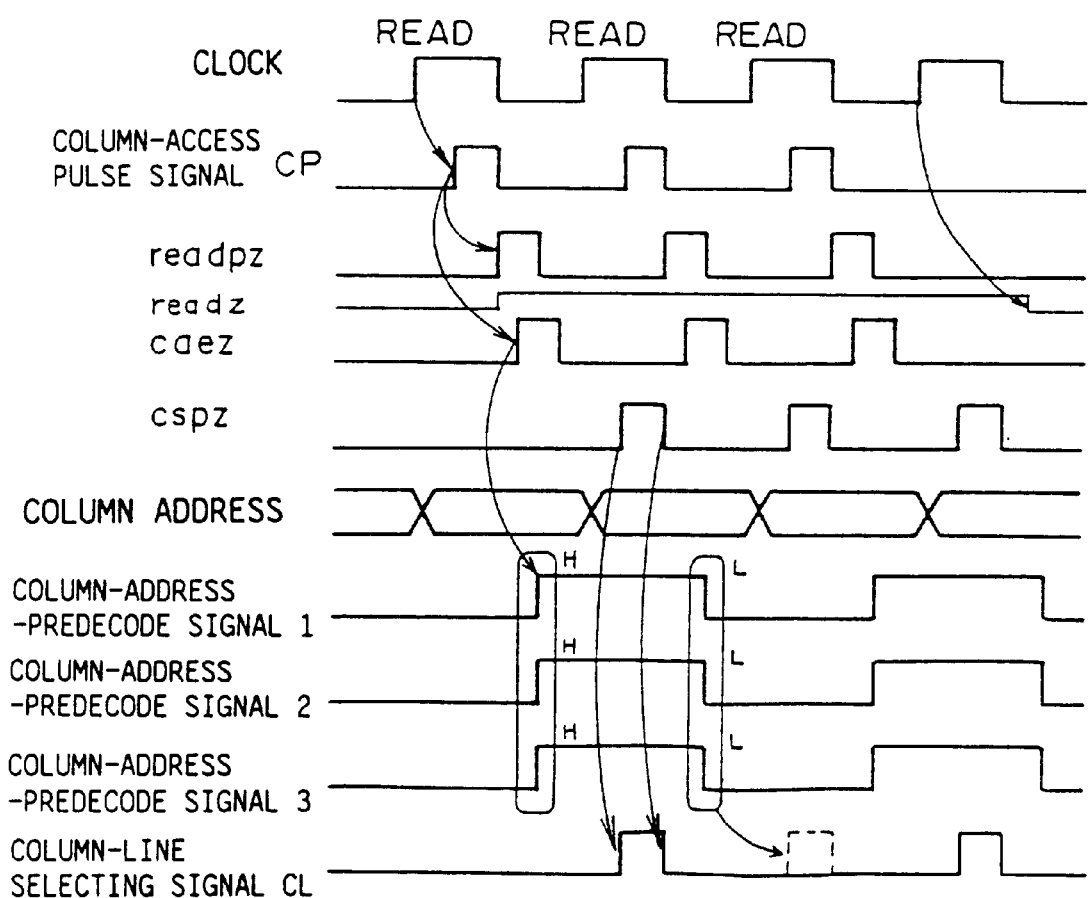
FIG. 13 is timing charts showing column-access operations of the DRAM of FIG. 3.

FIG. 13 is timing charts showing column-access operations of the DRAM of FIG. 3.

In synchronism with an external clock signal, control signals (READ) indicative of a read-operation mode are received. In this example, a total of three control signals are received. As described in connection with FIG. 8 through FIG. 10, the control signals are decoded by the packet-command decoder 12, and the column-access-pulse signal CP is generated. The column-access-pulse signal CP is supplied to the CAS-generation unit 22 of FIG. 3.

The CAS-generation unit 22 generates a read-mode-pulse signal readpz and a column-address-read signal caez. The read-mode-pulse signal readpz is supplied to the control unit 23 of FIG. 3, and the column-address-read signal caez is supplied to the pre-decoder 24 of FIG. 3.

Upon receiving the read-mode-pulse signal readpz, the control unit 23 generates a column-gate-selection-pulse signal cspz which defines a timing and a pulse width of the column-line selecting signal CL.

Further, the pre-decoder 24, having received the column-address-enable signal caez, pre-decodes the column address, and generates column-address-pre-decode signals. FIG. 13 shows an example in which column-address-pre-decode signals 1 through 3, representing 3 bits, are output from the pre-decoder 24.

The column decoder 25 of FIG. 3 receives the column-address-pre-decode signals and the column-gate-selection-pulse signal cspz, and supplies the column-line selecting signal CL to a column gate at a column address indicated by the column-address-pre-decode signals. A timing and a pulse width of the column-line selecting signal CL are determined by the column-gate-selection-pulse signal cspz.

In FIG. 13, a portion of the column-line selecting signal which is shown by broken lines indicates that a column line different form a line previously selected by the pre-decode signals (HHH) is selected by different pre-decode signals (LLL). Further, the readz signal is used by the selector-control unit of FIG. 17, and is generated by the control unit 23 of FIG. 3. This signal becomes H when the column-access-pulse signal CP is output in response to a rising edge of the clock, and becomes L when no pulse signal CP is supplied in response to a rising edge of the clock.

In this manner, data can be read from the core circuit 26 to the read buffer 28. The data stored in the read buffer 28 is then converted from parallel data to serial data by the conversion unit 29.

Figure 14:
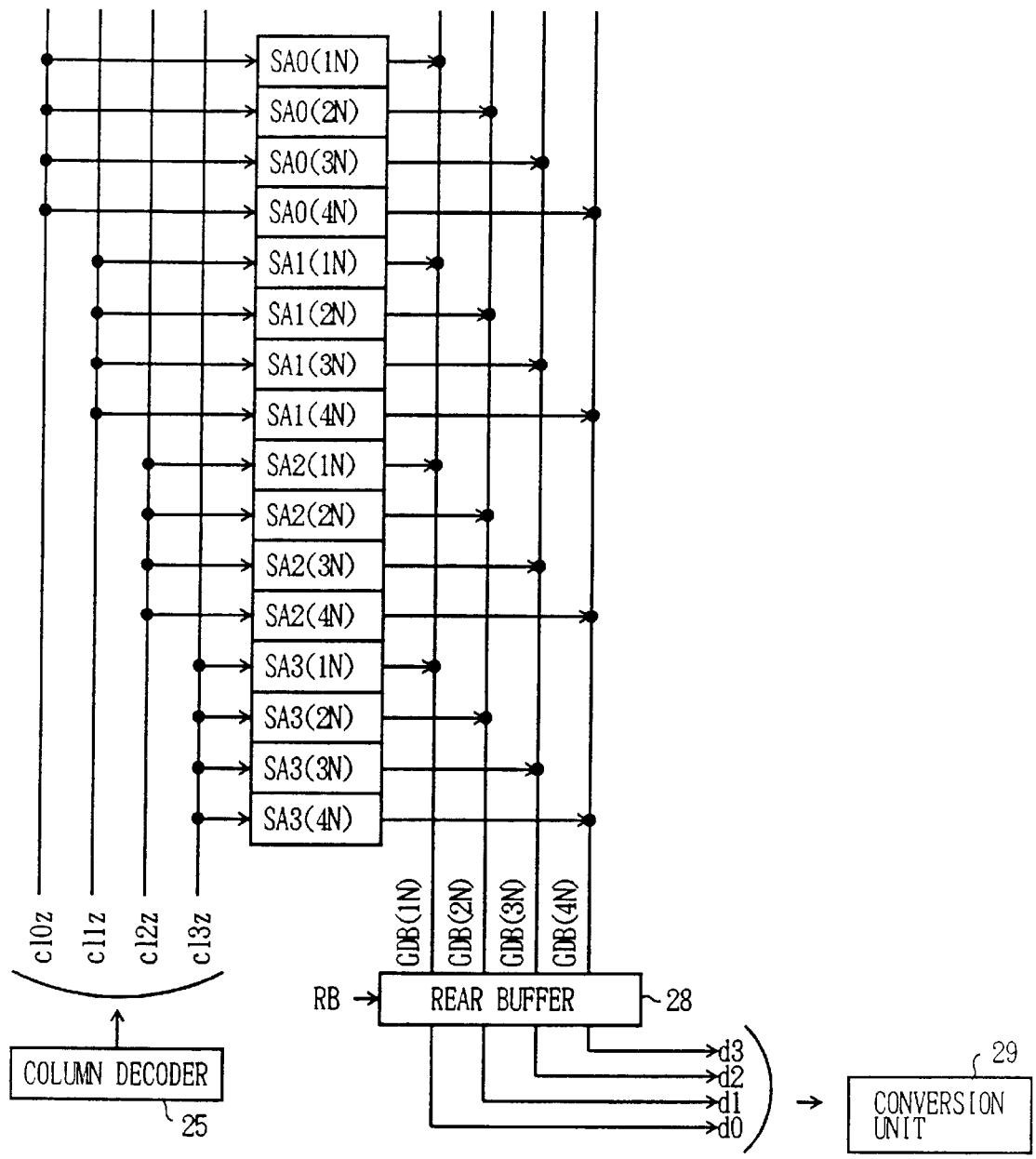
FIG. 14 is an illustrative drawing showing how parallel data is read from sense amplifiers of a core circuit, and is transferred to a conversion unit via a global-data bus and a read buffer.

FIG. 14 is an illustrative drawing showing how parallel data is read from the sense amplifiers of the core circuit 26, and is transferred to the conversion unit 29 via the global-data bus (GDB) and the read buffer 28. In this example, the parallel data comprised of four bits is transferred.

In the figure, 16 sense amplifiers are shown as SA0(1N) through SA3(4N). When a sub-word line SW (not shown) is selected, data is transferred from memory cells corresponding to the selected sub-word line to the 16 sense amplifiers, where the data is amplified.

When the data is amplified, the column decoder 25 changes a column-selection line c10z to HIGH (other lines c11z, c12z, and c13z remain LOW). In response, column gates corresponding to the sense amplifiers SA0(1N) through SA0(4N) are simultaneously opened, so that the data amplified by SA0(1N) through SA0(4N) is transferred to 4 global-data bus GDB(1N) through GDB(4N) in parallel.

It should be noted that exactly four column gates are always open simultaneously regardless of the burst length (1, 2, 4, . . . ) stored in the mode register 41. Therefore, parallel data output from the sense amplifiers is always comprised of 4 bits.

The four-bit parallel data is received and amplified by the read buffer 28, which is activated in response to the signal RB. Thereafter, the data is supplied to the conversion unit 29.

The conversion unit 29 attends to parallel-to-serial conversion of the parallel data supplied from the read buffer 28.

Figure 15:
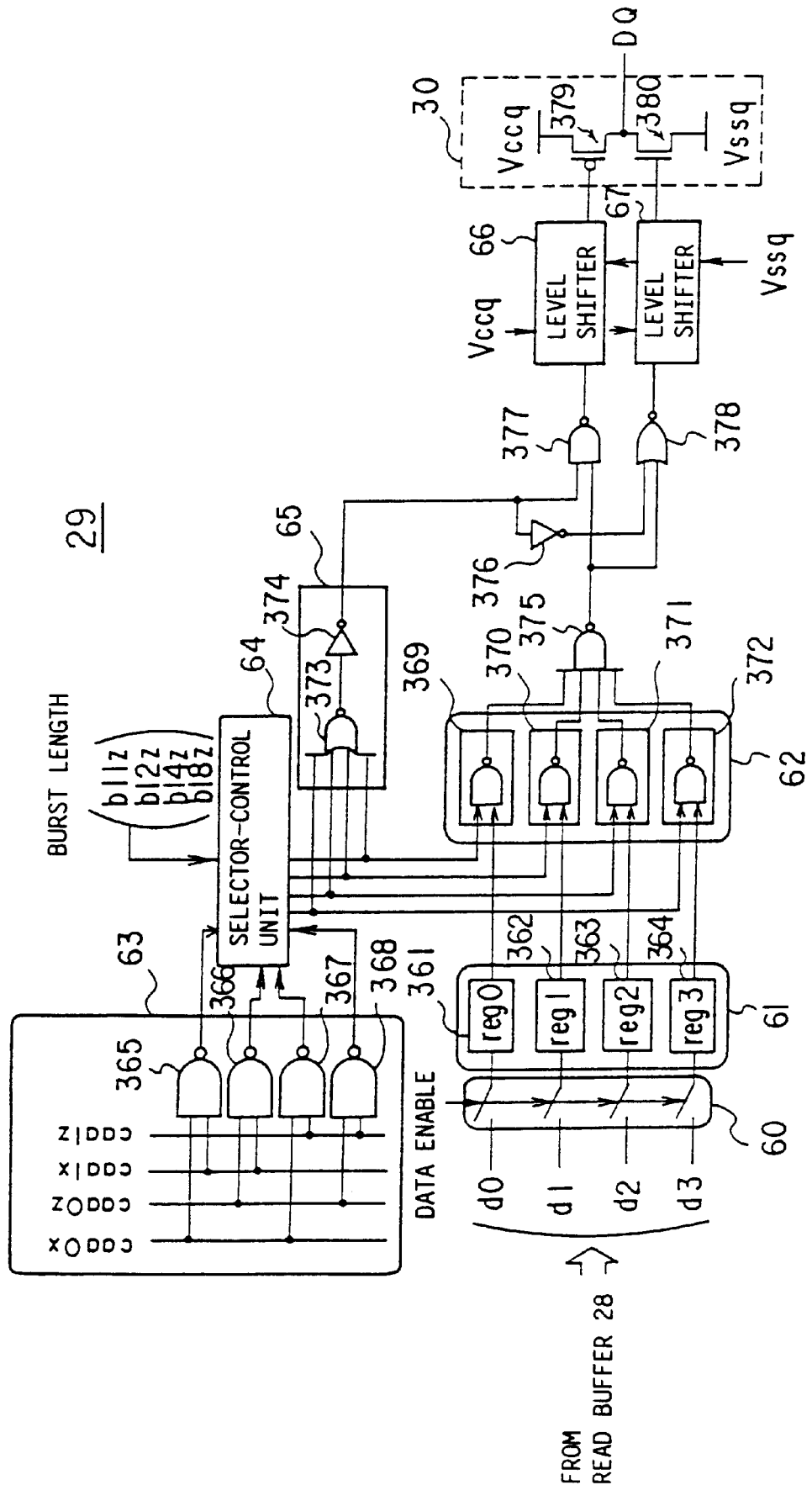
FIG. 15 is an illustrative drawing showing a configuration of a conversion unit.

FIG. 15 is an illustrative drawing showing a configuration of the conversion unit 29.

The conversion unit 29 of FIG. 15 includes a switch circuit 60, a register circuit 61 comprised of registers 361 through 364, a selector circuit 62 comprised of NAND circuits 369 through 372, an address-combination circuit 63 including NAND circuits 365 through 368, a selector-control unit 64, and a timing circuit 65 including a NOR circuit 373 and an inverter 374. The conversion unit 29 further includes a NAND circuit 375, an inverter 376, a NAND circuit 377, a NOR circuit 378, and level shifters 66 and 67. The level shifters 66 and 67 are connected to the output buffer 30 (see FIG. 3) which includes a PMOS transistor 379 and an NMOS transistor 380.

When a data-enable signal (e.g., obtained by delaying the cspz signal by a predetermined time length) is supplied from the control unit 23 of FIG. 3 to the switch circuit 60, the parallel data d0 through d3 provided from the read buffer 28 of FIG. 3 is read by the registers 361 through 364 (the register circuit 61). The parallel data d0 through d3 held by the register circuit 61 is then supplied to the selector circuit 62. In the selector circuit 62, the NAND circuits 369 through 372 are opened at timings controlled by the selector-control unit 64 so as to convert the parallel data d0 through d3 into serial data being output successively. The output serial data is supplied to the level shifters 66 and 67 at timings generated by the timing circuit 65. The level shifters 66 and 67 shift a voltage level of the data, and provides the voltage-level-shifted data for the output buffer 30.

Figure 16:
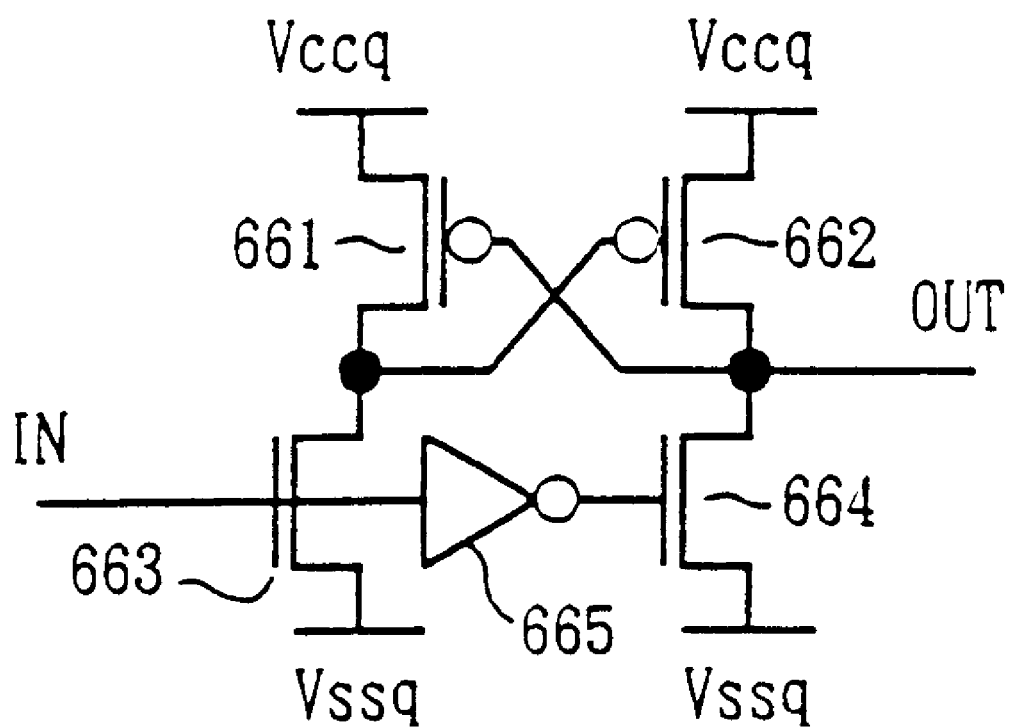
FIG. 16 is a circuit diagram showing an example of a level shifter.

FIG. 16 is a circuit diagram showing an example of any one of the level shifters 66 and 67. The level shifter includes a PMOS 661 and a PMOS 662 cross-connected to each other, an NMOS 663 connected in series with the PMOS 661 and receiving an input from the NAND circuit 377 or the NOR circuit 378, and an NMOS 664 connected in series with the PMOS 662 and receives an input from an inverter 665 that inverts the input of PMOS 663.

In this manner, the parallel data from the read buffer 28 is converted into the serial data through the conversion unit 29,
and, subsequently, is output from the output buffer 30 as a data signal DQ. At timings when the serial data is not supplied from the selector circuit 62, the output of the timing circuit 65 is LOW, so that the NAND circuit 377 and the NOR circuit 378 have a HIGH output and a LOW output, respectively. Because of this, the output of the output buffer 30 is kept in a floating state (high-impedence state) when serial data is not output.

Figure 17:
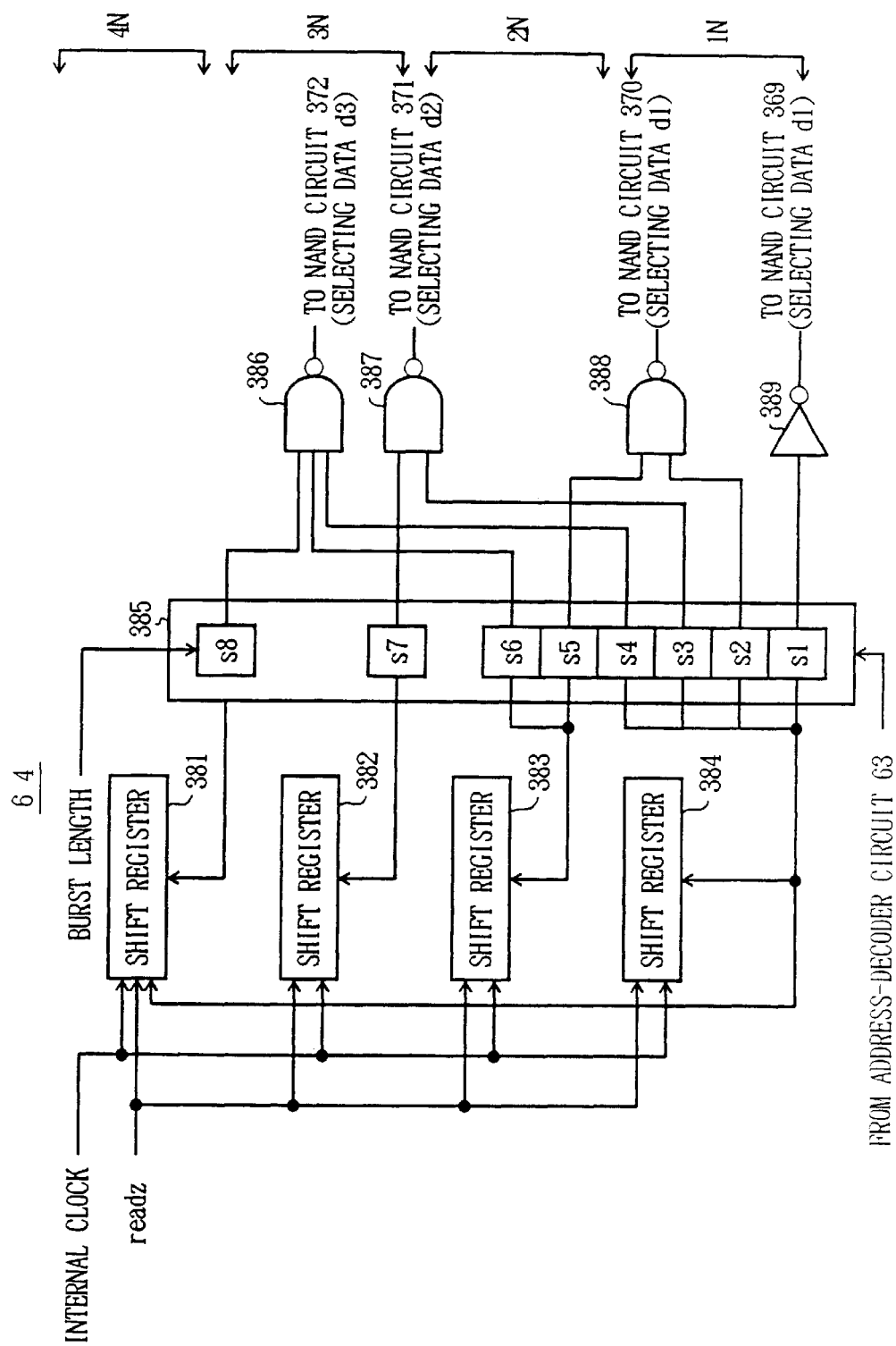
FIG. 17 is an illustrative drawing showing a configuration of a selector-control unit.

FIG. 17 is an illustrative drawing showing a configuration of the selector-control unit 64.

The selector-control unit 64 of FIG. 17 includes shift registers 381 through 384, a selector-switch circuit 385, NAND circuits 386 through 388, and an inverter 389. The selector-switch circuit 385 includes switches s1 through s8.

The internal clock signal supplied from the input buffers 11 of FIG. 3 is provided for the shift registers 381 through 384. The shift registers 381 through 384 further receive a read signal readz having a timing as shown in FIG. 13 from the control unit 23 of FIG. 3. Each of the four shift registers 381 through 384 is a one-bit shift register, and together form a four-bit shift register. Each of the shift registers 381 through 384 perform an up/down operation once in every four cycles in synchronism with the internal clock signal while the read signal readz is being input.

The selector-switch circuit 385 determines which one of the switches s1 through s8 is opened based on a burst length and column-address-combination signals from the address-combination circuit 63. The column-address-combination signals decide which one of the parallel-data bits d0 through d3 is to be output. The burst length is used for masking unselected bits among data bits to be serially output, so that the output DQ is controlled to be in a high-impedance state. The burst length is stored in the mode register 31 of FIG. 3, and may be set to 1, 2, 4, or 8.

As shown in FIG. 17, the switches s1 through s8 are organized into four groups 1N through 4N. The group 1N includes the switches s1 through s4. The group 2N includes the switches s5 and s6. The group 3N includes the switch s7. Further, the group 4N includes the switch s8. Activation/deactivation of switches in each group is controlled based on the burst length. When the burst length is 1 (i.e, when b11z is selected), for example, only the group 1N is activated, and other groups are deactivated. When the burst length is 2 (i.e., when b12z is selected), the groups 1N and 2N are activated while other groups are deactivated.

Column-address signals caa0x/z and caa1x/z (x and z are complementary to each other) are combined by the NAND circuits 365 through 368 as shown in FIG. 15, and are supplied to the selector-switch circuit 385 as the column-address-combination signals. The combination of column-address signals caa0x/z and caa1x/z decides which one of the parallel-data bits d0 through d3.

FIGS. 18A through 18C are drawings showing the way the selector circuit 62 and the selector-switch circuit 385 are selected when the burst length is 1, 2, and 4, respectively.

When the burst length is 1, as shown in FIG. 18A, the switches s1 through s4 of the group 1N are activated, and switches of the other groups 2N through 4N are deactivated. When the burst length is 1, a combination of column-address signals caa0x/z and caa1x/z is chosen to select one of the switches s1 through s4, thereby opening one of the NAND circuits 369 through 372. By changing caa0x and caa1x to HIGH, the switch s1 is selected, for example, thereby choosing the data d0. When caa0z and caa1z are changed to HIGH, the switch s4 is selected, for example, to choose the data d3. In this manner, when the burst length is 1, the combination of column-address signals determines which one of the data bits d0 through d3 is to be output.

When the burst length is 2, as shown in FIG. 18B, the groups 1N and 2N are active, and the other groups 3N and 4N are deactivated. When the burst length is 2, the column-address signals caa1x/z are ignored (fixed to HIGH), and either one of the column addresses caa0x/z is chosen to select switches so as to open either the NAND circuits 369 and 370 or the NAND circuits 371 and 372. When caa0x is changed to HIGH, the switches s1 and s5 are selected, for example. In this case, the data d0 and d1 is output as serial data in synchronism with the internal clock. By changing caa0z to HIGH, the switches s3 and s6 are chosen, for example. By doing so, data d2 and d3 are output as serial data in synchronism with the internal clock.

When the burst length is set to 4, as shown in FIG. 18C, all the groups 1N through 4N are activated. In this case, the switches s1, s5, s7, and s8 are selected regardless of the column-address signals. This allows data d0 through d3 to be output as serial data in synchronism with the internal clock.

Use of the conversion unit 29 described above makes it possible to convert the parallel data from the read buffer 28 of FIG. 3 into serial data, and to supply the serial data to the output buffer 30. Further, while the parallel-to-serial conversion is performed, the burst-length signal and some of the column-address signals are used to select a specified number of specified data bits.

Figure 19:
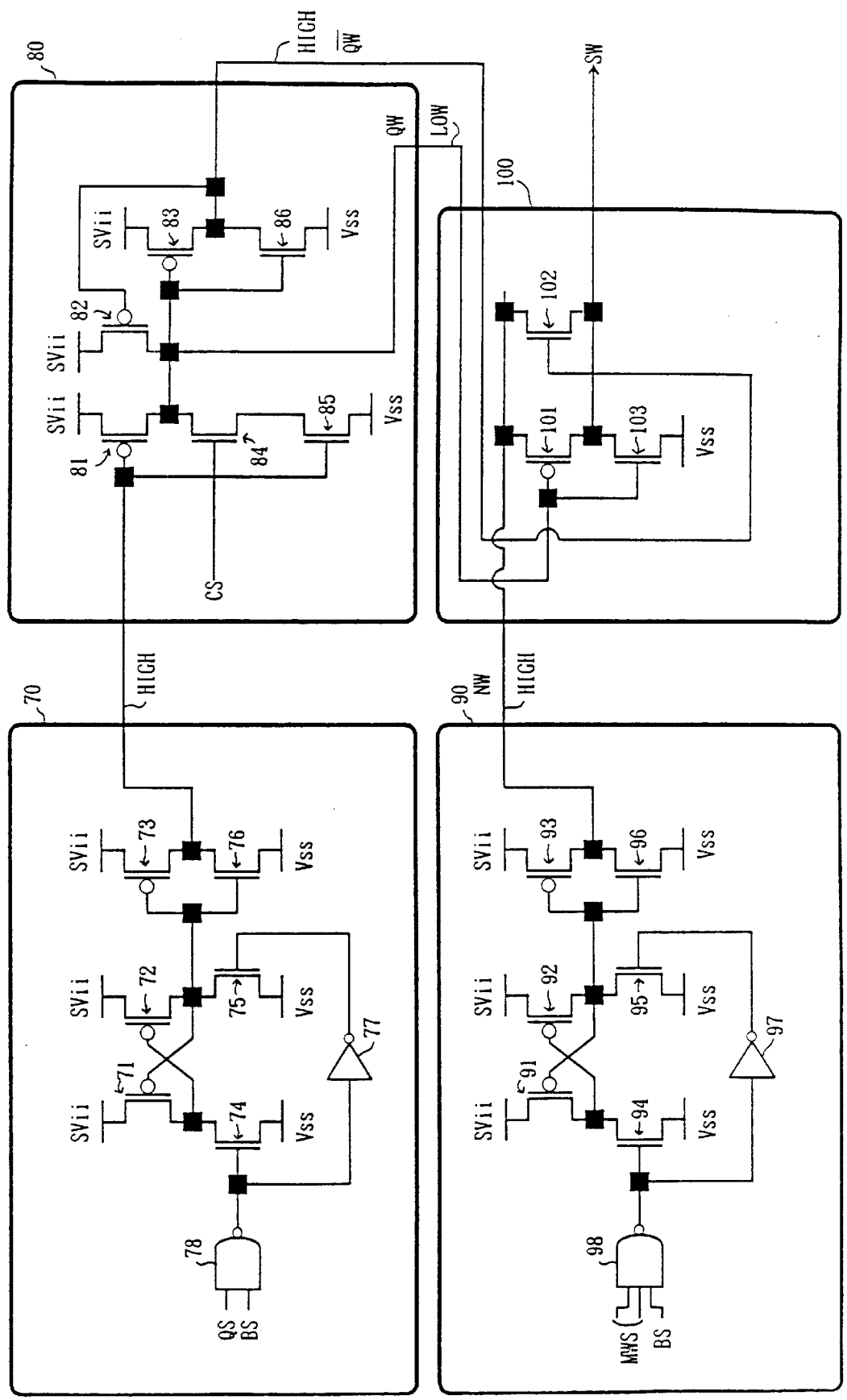
FIG. 19 is a circuit diagram of a word-line selecting circuit including a word decoder and a quarter decoder shown in FIG. 3.

FIG. 19 is a circuit diagram of a word-line selecting circuit including the word decoder 18 and the quarter decoder 21 shown in FIG. 3.

The word-line selecting circuit of FIG. 19 includes a main-quarter decoder 70, a sub-quarter decoder 80, a main-word decoder 90, and a sub-word decoder 100. The main-quarter decoder 70 and the sub-quarter decoder 80 correspond to the quarter decoder 21 of FIG. 3, and the main-word decoder 90 and the sub-word decoder 100 correspond to the word decoder 18 of FIG. 3.

The main-quarter decoder 70 includes PMOS transistors 71 through 73, NMOS transistors 74 through 76, an inverter 77, and a NAND circuit 78. The NAND circuit 78 receives a block selecting signal BS from the BLT decoder 19 and a main-quarter-decoder selecting signal QS from the pre-decoder 16. When the main-quarter decoder 70 of a pertinent block is selected, the NAND circuit 78 outputs a LOW signal. This LOW signal prompts the main-quarter decoder 70 to output a HIGH signal as shown in FIG. 19.

The sub-quarter decoder 80 includes PMOS transistors 81 through 83 and NMOS transistors 84 through 86. The PMOS transistor 81 an the NMOS transistor 85 receive the output of the main-quarter decoder 70 at a gate thereof. A gate of the NMOS transistor 84 receives a column-block selecting signal CS. The column-block selecting signal CS is used for selecting sub-word selecting lines with respect to a selected sense-amplifier block. When the column-block selecting signal CS and the output of the main-quarter decoder 70 are turned to HIGH, the sub-quarter decoder 80 outputs a HIGH signal and a LOW signal as shown in FIG. 19.

The main-word decoder 90 includes PMOS transistors 91 through 93, NMOS transistors 94 through 96, an inverter 97, and a NAND circuit 98. The NAND circuit 98 receives the block selecting signal BS from the BLT decoder 19 and a main-word-decoder selecting signal MWS from the pre-decoder 16. When the main-word decoder 90 of the pertinent block is selected, the NAND circuit 98 outputs a LOW signal. This LOW signal results in the main-word decoder 90 generating a HIGH output on a main-word line MW as shown in FIG. 19.

The sub-word decoder 100 includes a PMOS transistor 101 and NMOS transistors 102 and 103. When receiving the outputs of the main-word decoder 90 and the sub-quarter decoder 80 as shown in FIG. 19, the sub-word decoder 100 outputs a HIGH signal as the sub-word-line selecting signal SW. The sub-word-line selecting signal SW at the HIGH level selects a particular word line.

In FIG. 19, the column-block selecting signal CS is supplied to the sub-quarter decoder 80. Because of this, one sense-amplifier block can be selected from a plurality of sense-amplifier blocks, and data-read operations for conveying data to the bit lines can be conducted by selecting a word line only with respect to the selected sense-amplifier block.

Figure 20:
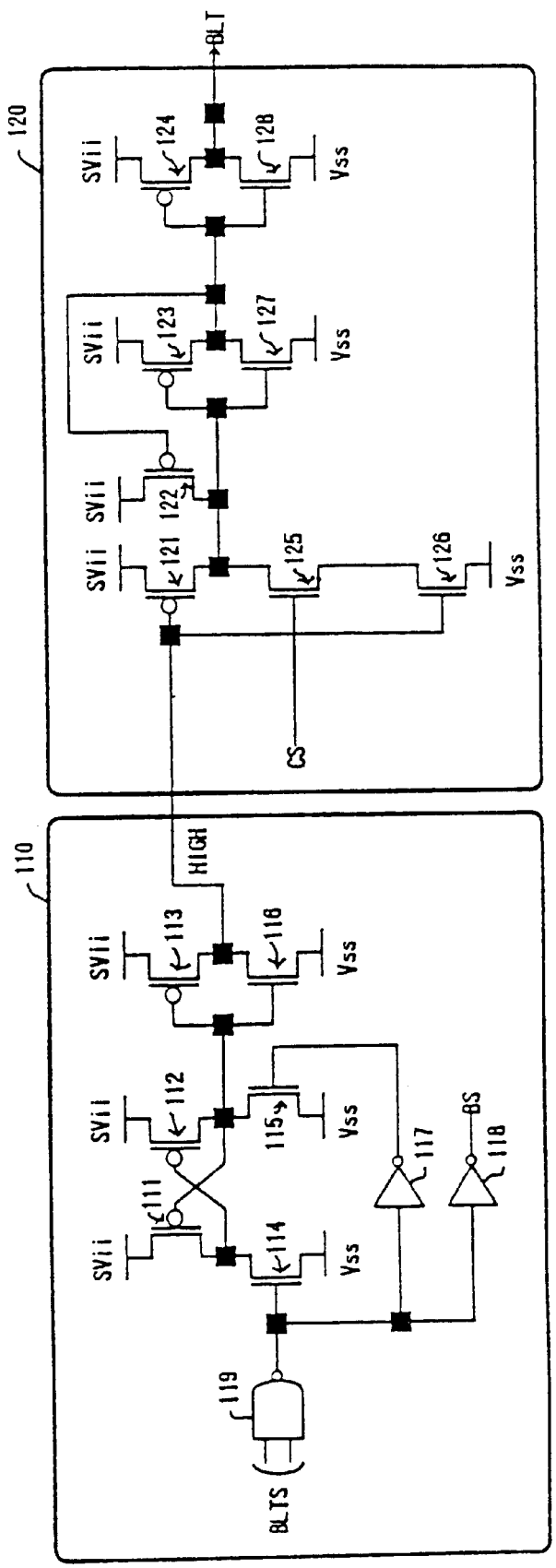
FIG. 20 is a circuit diagram of a bit-line-transfer-signal-generation circuit which includes a BLT decoder of FIG. 3.

FIG. 20 is a circuit diagram of a bit-line-transfer-signal-generation circuit which includes the BLT decoder 19 of FIG. 3.

The bit-line-transfer-signal-generation circuit of FIG. 20 includes a main-BLT-generation circuit 110 and a sub-BLT-generation circuit 120.

The main-BLT-generation circuit 110 includes PMOS transistors 111 through 113, NMOS transistors 114 through 116, inverters 117 through 118, and a NAND circuit 119. The NAND circuit 119 receives a main-BLT-generation-circuit selecting signal BLTS from the pre-decoder 16 of FIG. 3. When the pertinent main-BLT-generation circuit 110 is selected, the NAND circuit 119 outputs a LOW signal. This LOW signal prompts the main-BLT-generation circuit 110 to output a HIGH signal as shown in FIG. 20. Further, a block selecting signal BS is output from the inverter 118, and is supplied to the word decoder 18, the SA-generation unit 20, and the quarter decoder 21.

The sub-BLT-generation circuit 120 includes PMOS transistors 121 through 124 and NMOS transistors 125 through 128. Gates of the PMOS transistor 121 and the NMOS transistor 126 receives the output of the main-BLT-generation circuit 110. The NMOS transistor 125 receives the column-block selecting signal CS at a gate thereof. The column-block selecting signal CS is used for selecting bit-line-transfer gates with respect to a selected sense-amplifier block. When the column-block selecting signal CS and the output of the main-BLT-generation circuit 110 are HIGH, an output of the sub-BLT-generation circuit 120 serving as the bit-line-transfer signal BLT is activated.

In FIG. 20, the column-block selecting signal CS is supplied to the sub-BLT-generation circuit 120. Because of this, one sense-amplifier block can be selected from a plurality of sense-amplifier blocks, and the bit lines can be connected to the sense amplifiers of the selected sense-amplifier block.

Figure 21:
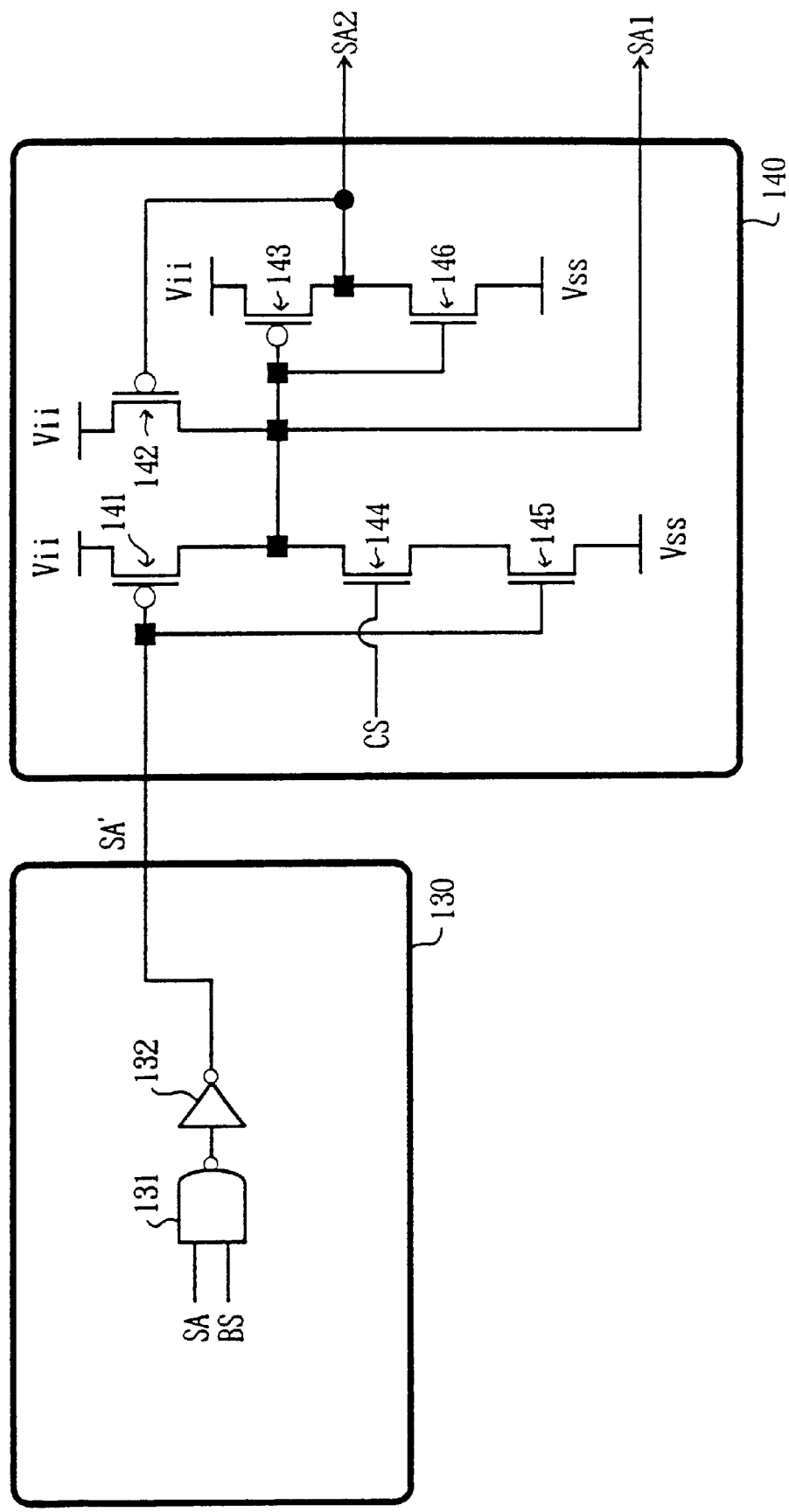
FIG. 21 is a circuit diagram of a sense-amplifier-driving-signal-generation circuit including an SA-generation unit of FIG. 3.

FIG. 21 is a circuit diagram of a sense-amplifier-driving-signal-generation circuit including the SA-generation unit 20 of FIG. 3.

The sense-amplifier-driving-signal-generation circuit of FIG. 21 includes a main-SA-generation circuit 130 and a sub-SA-generation circuit 140.

The main-SA-generation circuit 130 includes a NAND circuit 131 and an inverter 132. The NAND circuit 131 receives the block selecting signal BS from the BLT decoder 19 of FIG. 3 and a main-sense-amplifier-latch signal SA from the pre-decoder 16 of FIG. 3. When a pertinent block is selected, the main-SA-generation circuit 130 outputs the main-sense-amplifier-latch signal SA'.

The sub-SA-generation circuit 140 includes PMOS transistors 141 through 143 and NMOS transistors 144 through 146. Gates of the PMOS transistor 141 and the NMOS transistor 144 receive the main-sense-amplifier-latch signal SA' from the main-SA-generation circuit 130. A gate of the NMOS transistor 144 receives the column-block selecting signal CS. The column-block selecting signal CS is used for selecting a sense-amplifier block. When the column-block selecting signal CS is HIGH, the main-sense-amplifier-latch signal SA' prompts the sub-SA-generation circuit 140 to output the sense-amplifier driving signals SA1 and SA2 which are respectively LOW and HIGH.

In FIG. 21, the column-block selecting signal CS is supplied to the sub-SA-generation circuit 140. Because of this, one sense-amplifier block can be selected from a plurality of sense-amplifier blocks, and sense amplifiers can be driven only with respect to the selected sense-amplifier block.

As described above, a series of sense amplifiers is divided into a plurality of sense-amplifier blocks, and the sub-word-line selecting signal SW, the bit-line-transfer signal BLT, and the sense-amplifier driving signals SA1 and SA2 are activated only with respect to sense amplifiers of the selected sense-amplifier block.

This configuration has a series of sense amplifiers divided into a plurality of sense-amplifier blocks, and controls each of the sense-amplifier blocks separately. Such a configuration can enhance operation speed. In this case, however, a control circuit needs to be provided for each of the sense-amplifier blocks, thereby resulting in an increase in chip size. To obviate this problem, the bit-lint-transfer-signal-generation circuit may be structured such that a single sub-BLT-generation circuit extends over a plurality (e.g., two or three) sense-amplifier blocks.

Figure 22:
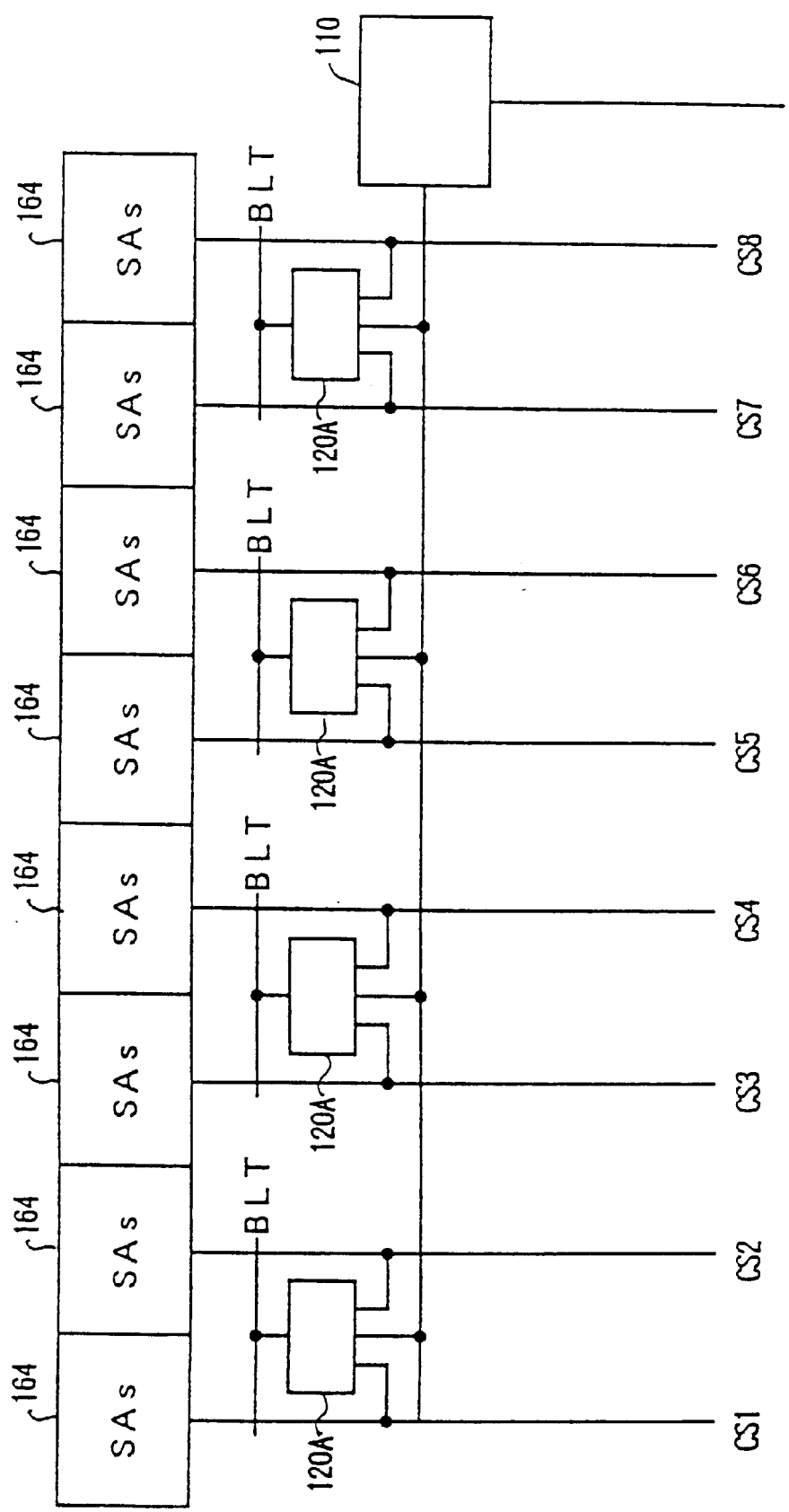
FIG. 22 is an illustrative drawing showing an arrangement in which each sub-BLT-generation circuit is provided for a corresponding plurality of sense-amplifier blocks.

FIG. 22 is an illustrative drawing showing an arrangement in which each sub-BLT-generation circuit is provided for a corresponding plurality of sense-amplifier blocks. In FIG. 22, a signal output from the main-BLT-generation circuit 110, which is the same as the one shown in FIG. 20, is supplied to sub-BLT-generation circuits 120A, wherein each of the sub-BLT-generation circuit 120A is provided for every two sense-amplifier blocks 164. Here, CS1 through CS8 designate column-block selecting signals, each of which selects a respective one of the eight sense-amplifier blocks 164 shown in FIG. 22, and is generated by the pre-decoder 24 of FIG. 3. Each of the sub-BLT-generation circuits 120A further receives the column-block selecting signals CSn and CSn+1 (n: odd number) which are adjacent to each other. When either one of the column-block selecting signals CSn and CSn+1 becomes HIGH and the signal output from the main-BLT-generation circuit 110 is changed to HIGH, the sub-BLT-generation circuit 120A activates the bit-line-transfer signal BLT.

Figure 23:
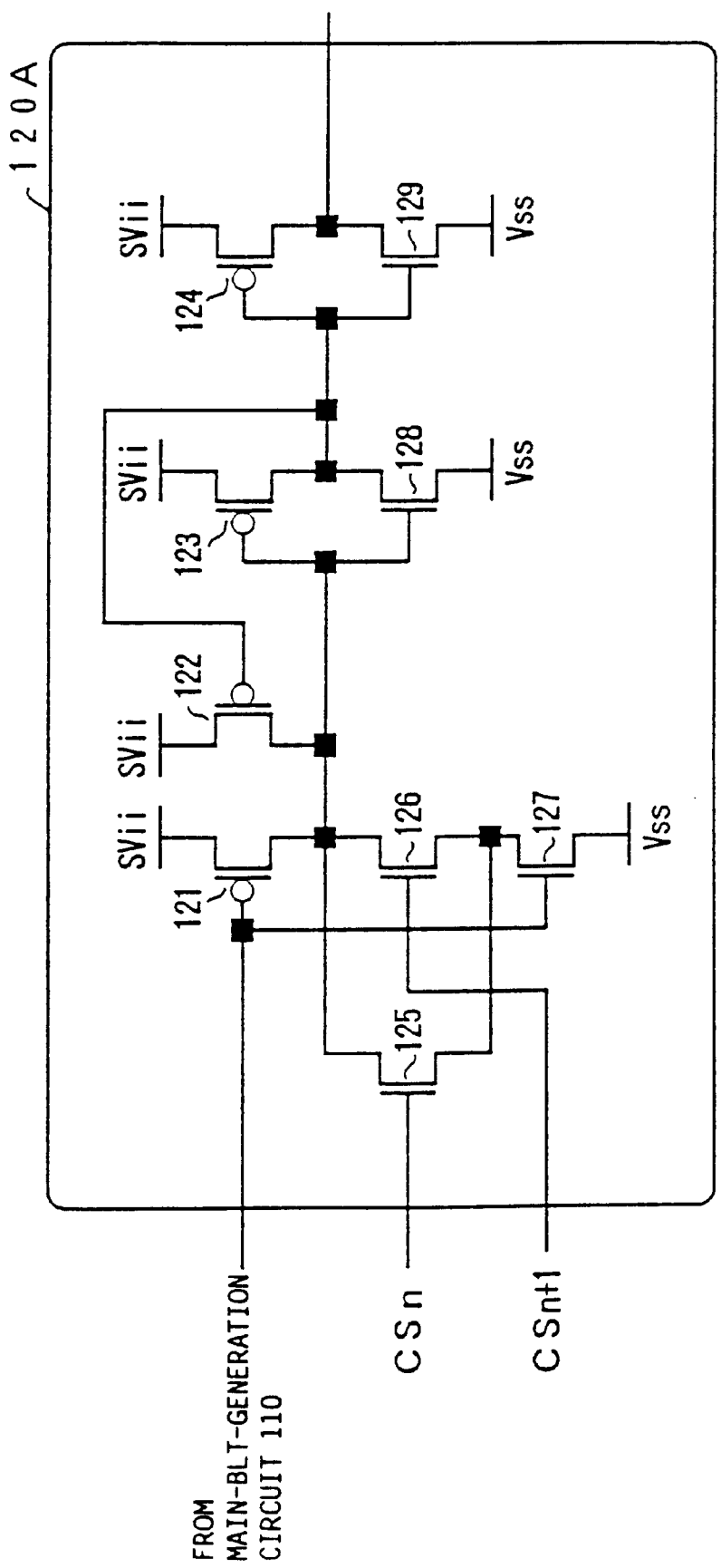
FIG. 23 is a circuit diagram of a sub-BLT-generation circuit.

FIG. 23 is a circuit diagram of the sub-BLT-generation circuit 120A.

The sub-BLT-generation circuit 120A includes PMOS transistors 121 through 124 and NMOS transistors 125 through 129. Gates of the PMOS transistor 121 and the NMOS transistor 127 receive the output of the main-BLT-generation circuit 110. A gate of the NMOS transistor 125 receives the column-block selecting signal CSn, and a gate of the NMOS transistor 126 receives the column-block selecting signal CSn+1. When both of the column-block selecting signals CSn and CSn+1 become HIGH and the output of the main-BLT-generation circuit 110 is changed to HIGH, the sub-BLT-generation circuit 120A activates an output thereof, i.e., activates the bit-line-transfer signal BLT.

In this manner, a control circuit (sub-BLT-generation circuit 120A) can be provided for a plurality (two in the example shown in FIG. 22 and FIG. 23) of sense-amplifier blocks, thereby suppressing an increase in a circuit size. By the same token, a control circuit for resetting the bit lines can be provided for a plurality of sense-amplifier blocks.

Figure 24:
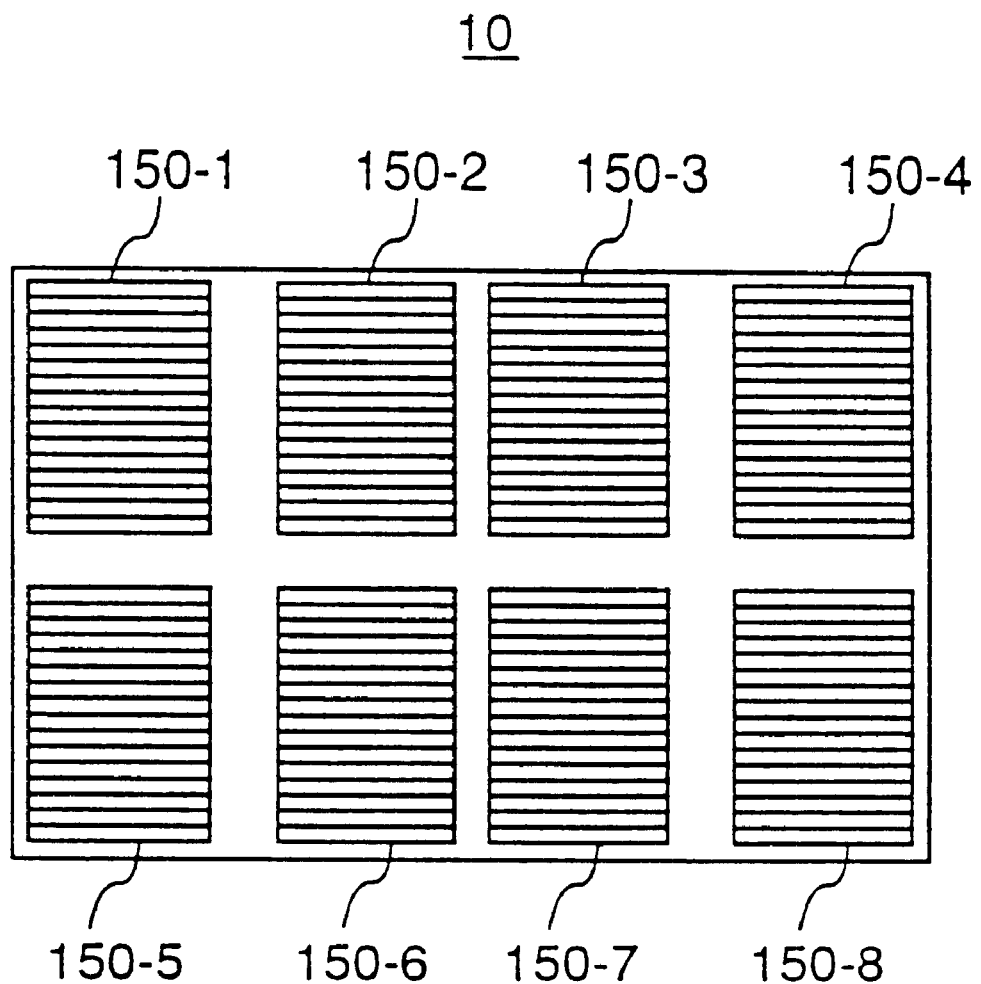
FIG. 24 is an illustrative drawing showing a chip configuration of the DRAM according to the present invention.

FIG. 24 is an illustrative drawing showing a chip configuration of the DRAM 10 according to the present invention. As shown in FIG. 24, the DRAM 10 of the present invention includes eight cell-array blocks (banks) 150-1 through 150-8, for example.

Figure 25:
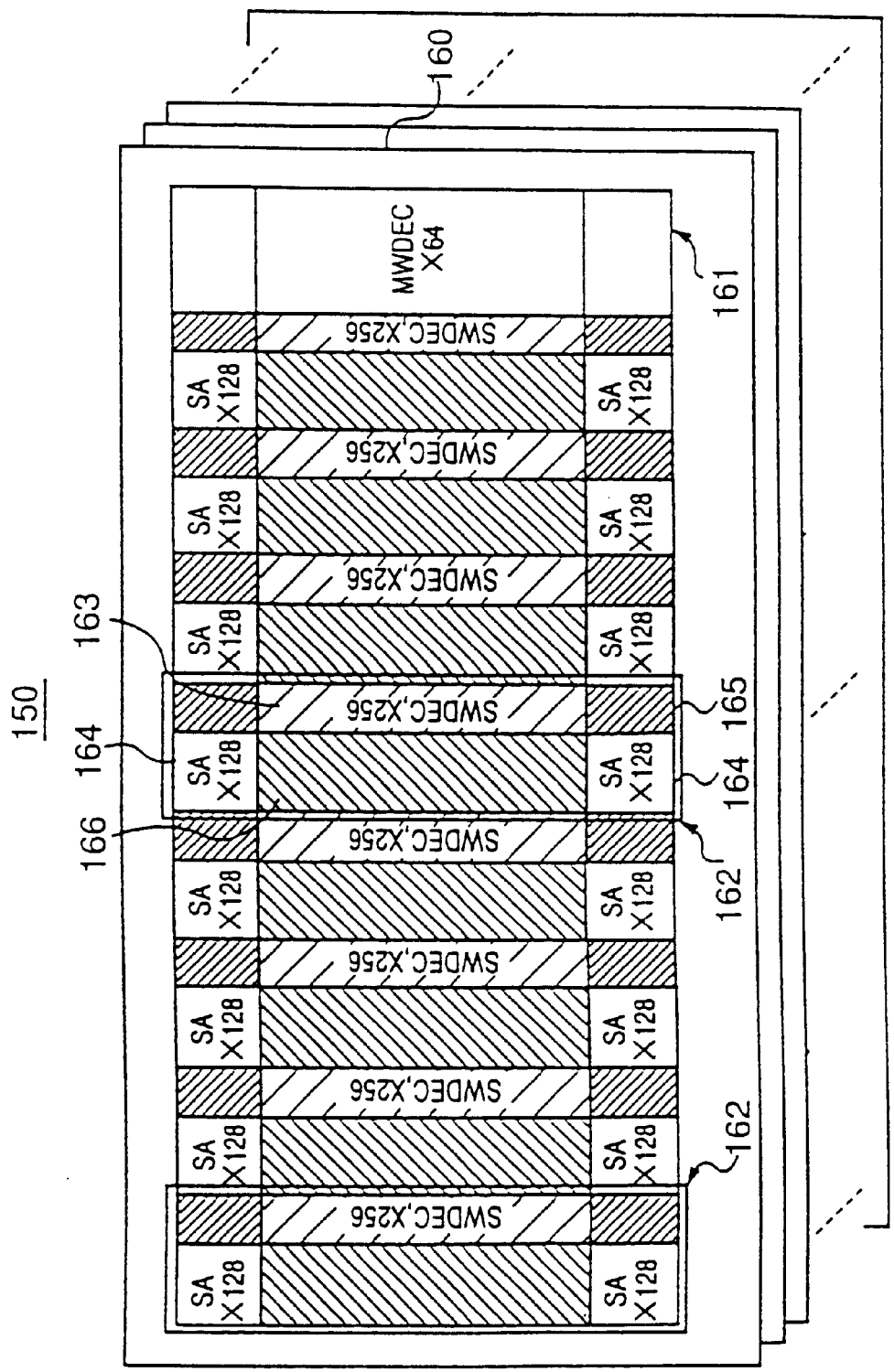
FIG. 25 is an illustrative drawing showing a configuration of a cell-array block of FIG. 24.

FIG. 25 is an illustrative drawing showing a configuration of the cell-array block of FIG. 24. FIG. 25 shows an arbitrary one of the cell-array blocks 150-1 through 150-8 of FIG. 24, which is hereinafter referred to as a cell-array block 150.

The cell-array block 150 includes a main-word-decoder area 160 corresponding to the main-word decoder 90 of FIG. 19, an m-s cross area 161, and eight sub-blocks 162. Each of the sub-blocks 162 includes a sub-word-decoder area 163 corresponding to the sub-word decoder 100 of FIG. 19, a sense-amplifier block 164 including a plurality of sense amplifiers corresponding to the sense amplifier 520 of FIG. 1, an s—s cross area 165, and a memory-cell area 166 including memory cells, sub-word selecting lines, bit lines, etc.

The m-s cross area 161 includes the main-quarter decoder 70 of FIG. 19, the main-BLT-generation circuit 110 of FIG. 20, and the main-SA-generation circuit 130 of FIG. 21. The s—s cross area 165 includes the sub-quarter decoder 80 of FIG. 19, the sub-BLT-generation circuit 120 of FIG. 20, and the sub-SA-generation circuit 140 of FIG. 21.

As shown in FIG. 1, a pair of sense-amplifier driving transistors, comprised of the PMOS transistor 513 and the NMOS transistor 512 operating in response to the sense-amplifier-driving signals SA1 and SA2, activates the sense amplifier 520. Such a pair of sense-amplifier driving transistors may be provided for each sense-amplifier block 164 to drive the plurality of sense amplifiers included therein. In this configuration, the sense-amplifier driving transistors may be provided at the s—s cross area 165.

If the load required for driving the plurality of sense amplifiers of each sense-amplifier block is heavy, the sense-amplifier driving transistors may be required to have such a large size that the s—s cross area 165 cannot have spare space for accommodating other circuits. In such a case, a sense-amplifier driving transistor per sense amplifier may be provided, and may be implemented inside the sense-amplifier block 164.

The layout describe above helps to implement a configuration in which a series of sense amplifiers is divided into a plurality of sense-amplifier blocks 164, and the sub-word-line selecting signal SW, the bit-line-transfer signal BLT, and the sense-amplifier driving signals SA1 and SA2 are activated only with respect to the selected one of the sense-amplifier blocks 164. By doing so, the load on these signals is lightened to achieve a high-speed change in signal levels.

Figure 26:
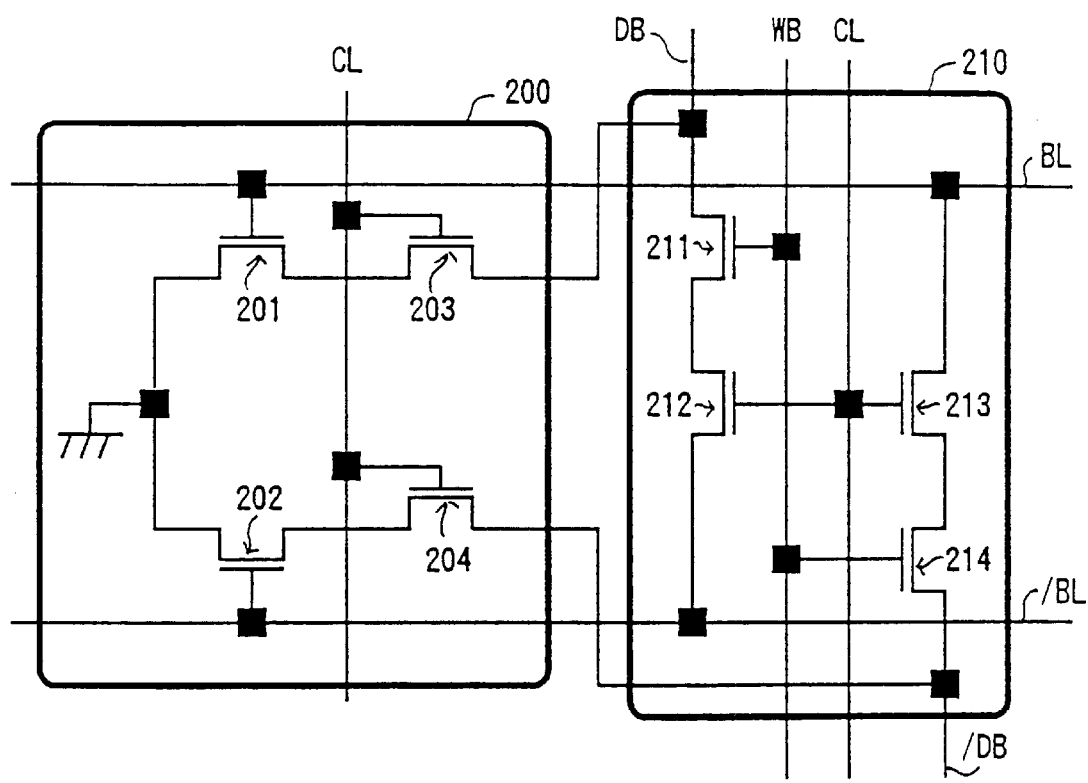
FIG. 26 is a circuit diagram for explaining data read/write operations based on a direct sense-amplifier scheme.

FIG. 26 is a circuit diagram for explaining data read/write operations based on a direct sense-amplifier scheme.

In the configuration of FIG. 1, a transfer-column-gate scheme is employed for the data-read/write operations. The transfer-column-gate scheme uses the NMOS transistors 510 and 511 as column gates. In the transfer-column-gate scheme as shown in FIG. 1, voltage levels of the bit-lines BL and /BL may change because of the load of the data bus DB and /DB when the data of the bit-lines BL and /BL is read to the data bus DB and /DB. If the sub-word-line selecting signal SW is changed to LOW while the voltage levels are at changed levels so as to close the NMOS transistor 502 serving as a cell gate, it is possible that the data of the memory cell 501 may change because of the changed voltage levels. In order to avoid this, the sub-word-line selecting signal SW needs to wait for the voltage levels of the bit-lines BL and /BL to return to stable conditions before changing the sub-word-line selecting signal SW to LOW.

When the transfer-column-gate scheme is employed, therefore, the precharge operations have to be carried out after the voltage levels of the bit-lines BL and /BL return to the stable conditions. This hampers an effort to advance the timing of the self-precharge operation as much as possible according to the present invention. Use of the direct-sense-amplifier scheme as shown in FIG. 26 allows the timing of the self-precharge operation to be further advanced, thereby further enhancing the operation speed.

In the direct-sense-amplifier scheme of FIG. 26, a data-read circuit 200 and a data-write circuit 210 are used in place of the column gates 510 and 511 of FIG. 1. The data-read circuit 200 includes NMOS transistors 201 through 204, and the data-write circuit 210 includes NMOS transistor 211 through 214.

During the data-read operation, the column-line selecting signal CL is changed to HIGH after the data transferred to the bit-lines BL and /BL is stabilized, so that the NMOS transistors 203 and 204 are turned on in the data-read circuit 200. Since the NMOS transistors 201 and 202 are turned on or off depending on the data of the bit-lines BL and /BL, the data ends up appearing on the data bus DB and /DB. At the time of data-read operation, a write-block selecting signal WB is kept at a LOW level, so that the NMOS transistors 211 and 214 are turned off in the data-write circuit 210.

At the time of the data-write operation, the write-block selecting signal WB is changed to HIGH to turn on the NMOS transistors 211 and 214 in the data-write circuit 210. After this, the data to be written arrives on the data bus DB and /DB. When the column-line selecting signal CL is changed to HIGH, the NMOS transistors 212 and 213 in the data-write circuit 210 are turned on. This allows the data of the data bus DB and /DB to be transferred to the bit-lines BL and /BL. When this happens, the NMOS transistors 203 and 204 in the data-read circuit 200 are also turned on. Since the write signal has stronger driving power, however, the data-write operation can be conducted without a problem.

In this manner, the direct-sense-amplifier scheme does not connect the bit-lines BL and /BL directly to the data bus DB and /DB at the time of data-read operations. Alternately, the NMOS transistors 201 and 202 are driven by voltage levels of the bit-lines BL and /BL to transfer data to the data bus DB and /DB. The voltage levels of the bit-lines BL and /BL thus do not change because of the load of the data bus DB and /DB.

Figure 27A:
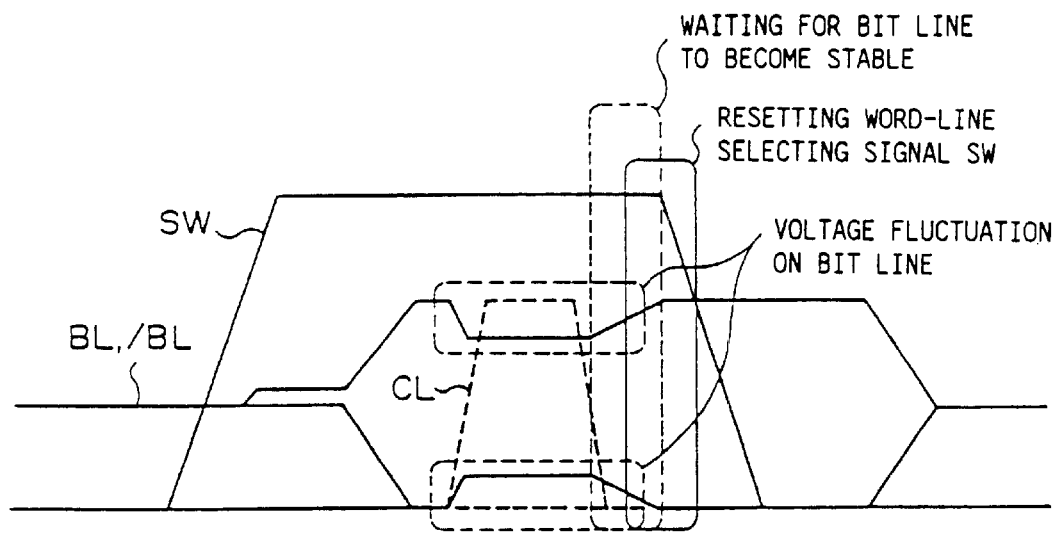
FIGS. 27A and 27B are timing charts showing timings of a sub-word-line selecting signal, a column-line selecting signal, and a bit-line signal with respect to a transfer-column-gate scheme and a direct-sense-amplifier scheme.
Figure 27B:
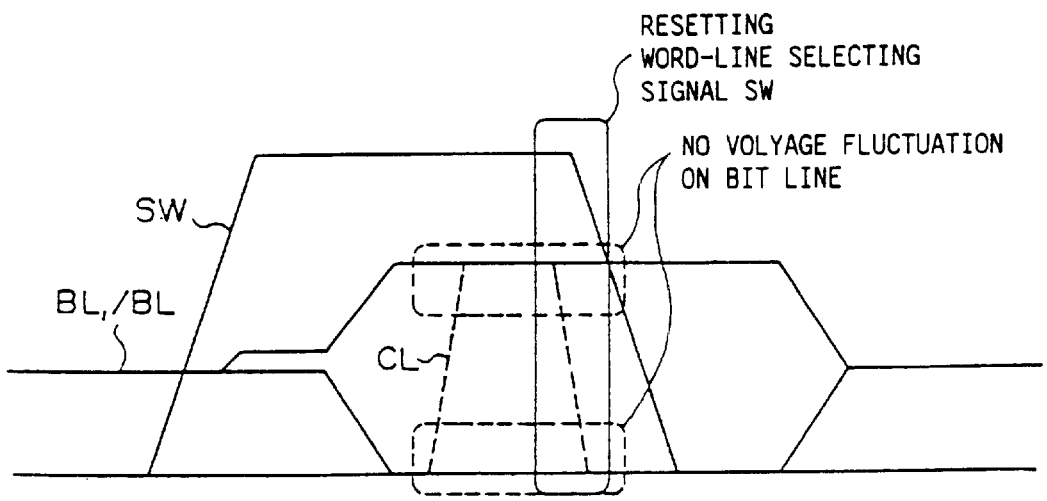

FIGS. 27A and 27B are timing charts showing timings of the sub-word-line selecting signal SW, the column-line selecting signal CL, and the bit-lines BL and /BL with respect to the transfer-column-gate scheme and the direct-sense-amplifier scheme.

FIG. 27A shows the transfer-column-gate scheme. When the column-line selecting signal CL is changed to HIGH, the voltage levels of the bit-lines BL and /BL suffer fluctuation. The sub-word-line selecting signal SW is reset after waiting for this voltage fluctuation to disappear. In the direct-sense-amplifier scheme of FIG. 27B, on the other hand, the voltage levels of the bit-lines BL and /BL do not fluctuate even when the column-line selecting signal CL is changed to HIGH to read data. It is possible, therefore, to reset the sub-word-line selecting signal SW through the self-precharge operation to precharge the bit-lines BL and /BL immediately after the data of the bit-lines BL and /BL is read.

In this manner, use of the direct-sense-amplifier scheme allows the timing of the self-precharge operation to be further advanced, thereby further enhancing the data-read-operation speed.

Figure 28A:
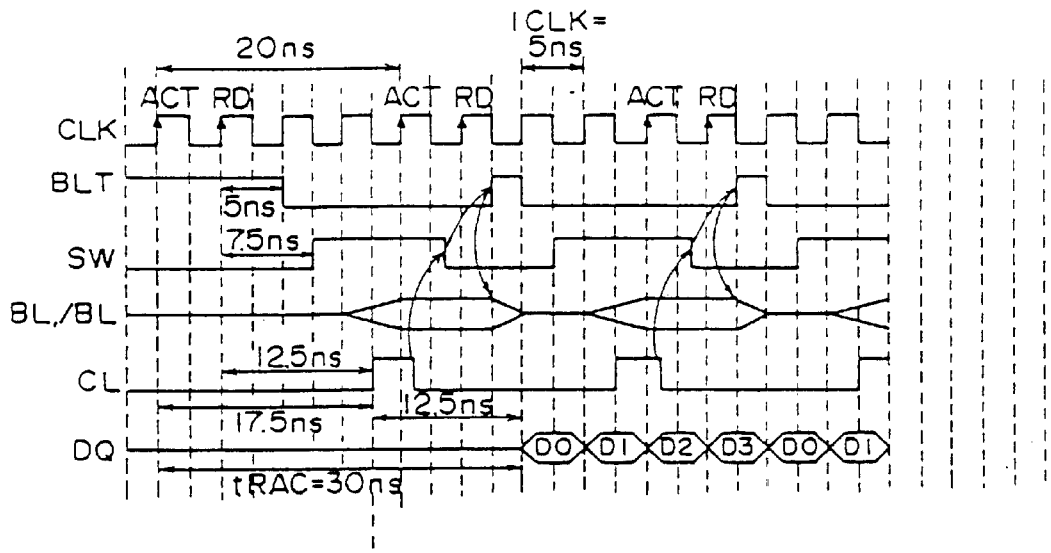
FIGS. 28A and 28B are illustrative drawings for explaining problems that occur when a clock frequency is lowered.
Figure 28B:
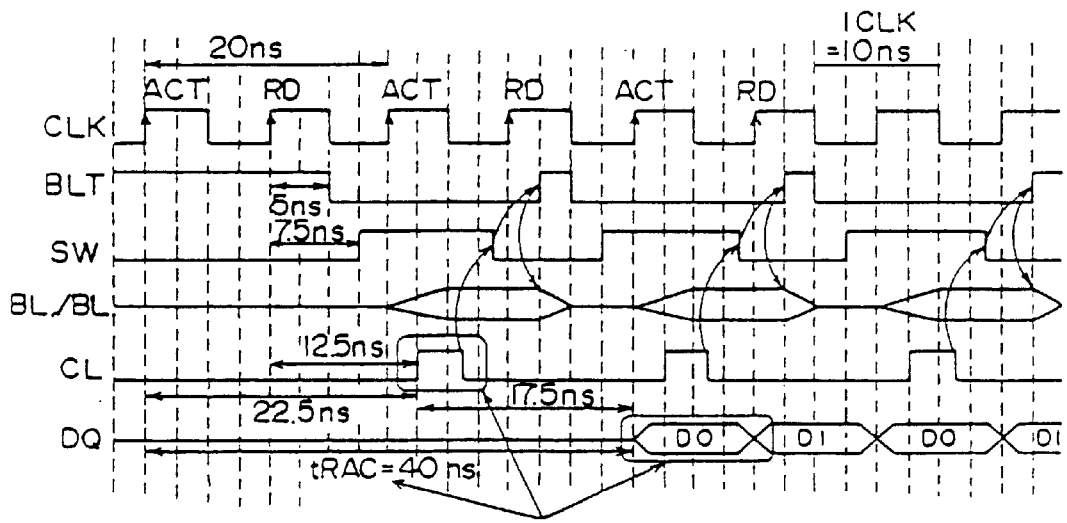

FIGS. 28A and 28B are illustrative drawings for explaining problems that occur when a clock frequency is lowered.

The column-line selecting signal CL is changed to HIGH when an indicated column line is selected a predetermined time period after the column address is input along with the read command RD. Namely, the timing at which the column-line selecting signal CL becomes HIGH is at an end of the predetermined time period after the input timing of the read command RD. Because of this, when the read command RD is input during a cycle immediately following a cycle for receiving the activation command ACT as shown in FIGS. 4A through 4K, the rise timing of the column-line selecting signal CL is determined not by the input timing of the activation command ACT, but is defined by the input timing of the read command RD.

In such a configuration, when a frequency of the clock signal is decreased, a time period tRAC, which is defined as a period from the input of the activation command ACT to the output of data, is undesirably prolonged.

FIG. 28A shows a timing chart regarding operations when the clock cycle is 5 ns. As shown in the figure, the column-line selecting signal CL is changed to a HIGH level 12.5 ns after the input of the read command RD. Since one clock has a duration of 5 ns, a time period between the input of the activation command ACT and the timing when the column-line selecting signal CL is changed to HIGH is 17.5 ns. Assuming that data output starts 12.5 ns after the column-line selecting signal CL is changed to HIGH, the time period tRAC between the input of the activation command ACT and the output of data is 30 ns.

FIG. 28B shows a timing chart regarding operations when the clock cycle is 10 ns. As shown in the figure, the column-line selecting signal CL is changed to a HIGH level 12.5 ns after the input of the read command RD. Since one clock has a duration of 10 ns, a time period between the input of the activation command ACT and the timing when the column-line selecting signal CL is changed to HIGH is 22.5 ns. Assuming that data output starts 17.5 ns after the column-line selecting signal CL is changed to HIGH, the time period tRAC between the input of the activation command ACT and the output of data is 40 ns.

As described above, when the activation command ACT and the read command RD are input in this order during successive two cycles, the rise timing of the column-line selecting signal CL is dependent on the input timing of the read command, which is received after the input of the activation command ACT. A lower frequency of the clock signal, therefore, means that the time period tRAC between the input of the activation command and the output of data is elongated.

In order to obviate this problem, the activation command ACT and the read command RD may be input simultaneously.

Figure 29:
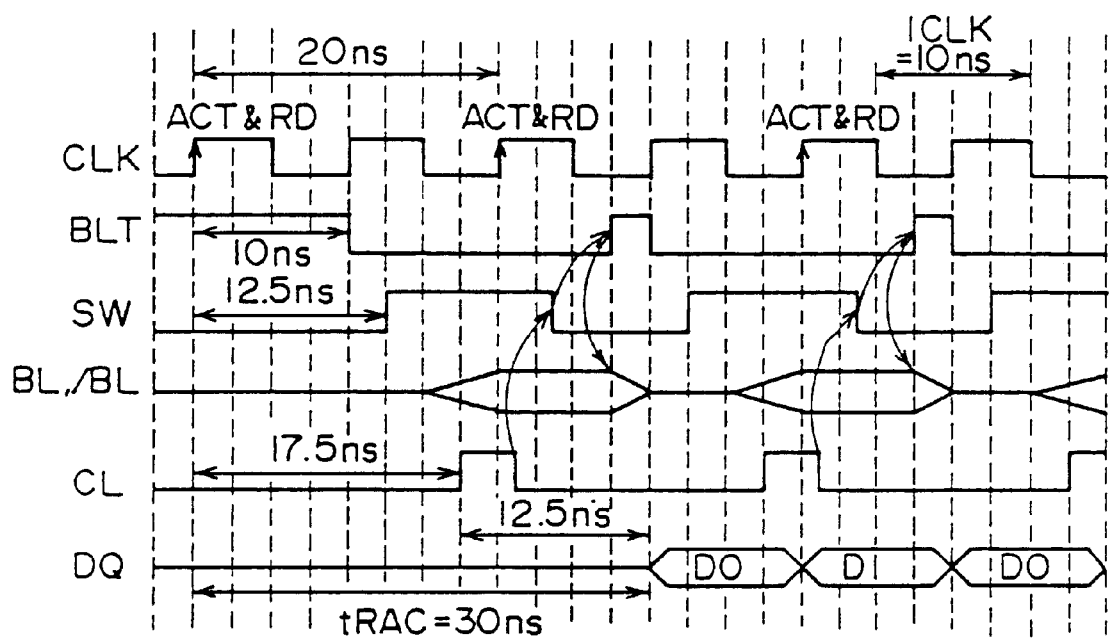
FIG. 29 is a timing chart showing operations when the activation command ACT and a read command RD are input simultaneously.

FIG. 29 is a timing chart showing operations when the activation command ACT and the read command RD are input simultaneously.

FIG. 29 shows operations when the clock cycle is 10 ns. The column-line selecting signal CL is changed to a HIGH level 17.5 ns after the input of the read command RD. Since the activation command ACT and the read command RD are input simultaneously, a time period between the input of the activation command ACT and the timing when the column-line selecting signal CL is changed to HIGH is also 17.5 ns. Assuming that data output starts 12.5 ns after the column-line selecting signal CL is changed to HIGH, the time period tRAC between the input of the activation command ACT and the output of data is 30 ns. This figure is the same as the case of the 5-ns clock cycle.

In this manner, a configuration in which the activation command ACT and the read command RD are input simultaneously ensures a constant length of the time period tRAC irrespective of the clock frequency. Simultaneous input of the activation command ACT and the read command RD naturally requires that these command, a row address, and a column address be input at the same time. In order to implement this operation, separate address-input pins may be provided for row-address input and for column-address input. An address input to the row-address-input pins is directed to the row-address-control system, and an address input to the column-address-input pins is supplied to the column-address-control system.

The above description has been provided by treating the activation command ACT and the read command RD as separate commands that are input simultaneously. Alternatively, a single command equivalent to ACT+RD may be provided, and may be input in synchronism with a rising edge of the external clock CLK.

FIG. 30 is a block diagram showing another configuration of a DRAM according to the present invention. In the configuration of FIG. 30, the activation command ACT and the read command RD are simultaneously input as described above. In FIG. 30, the same elements as those of FIG. 3 are referred to by the same numerals, and a description thereof will be omitted.

A DRAM 10A of FIG. 30 includes input buffers 11A for receiving the control signal, the row-address signal, and the column-address signal, respectively, and further includes a command decoder 12A. Each of the input buffers 11A may be a conventional buffer for receiving a corresponding signal in synchronism with the internal clock signal, which is supplied from the input buffers 11 for receiving the clock signal. A received row address is supplied to the pre-decoder 16 of the row-access system, and a received column address is provided to the pre-decoder 24 of the column-access system. In this manner, separate address-input buffers are provided for the row-address input and the column-address input, and, also, the row address and the column address are separately supplied to the row-address-control system and to the column-address-control system, respectively. This achieves simultaneous input of the row address and the column address.

The command decoder 12A does not distribute commands included in a packet to the row-access system and the column-access system, which is different from the case of the packet-command decoder 12 shown in FIG. 3. The command decoder 12A of FIG. 30 thus may be a conventional command decoder. As a means for inputting the activation command ACT and the read command RD at the same time, a corresponding combination of control signals may be provided so as to indicate a simultaneous start of the row-access-control operations and the column-access-control operations.

Accordingly, designs of control systems do not have to be changed with respect to other portions of the device, and the same configuration as that of FIG. 3 can be used for the other portions to implement the simultaneous input of the activation command ACT and the read command RD.

Figure 31:
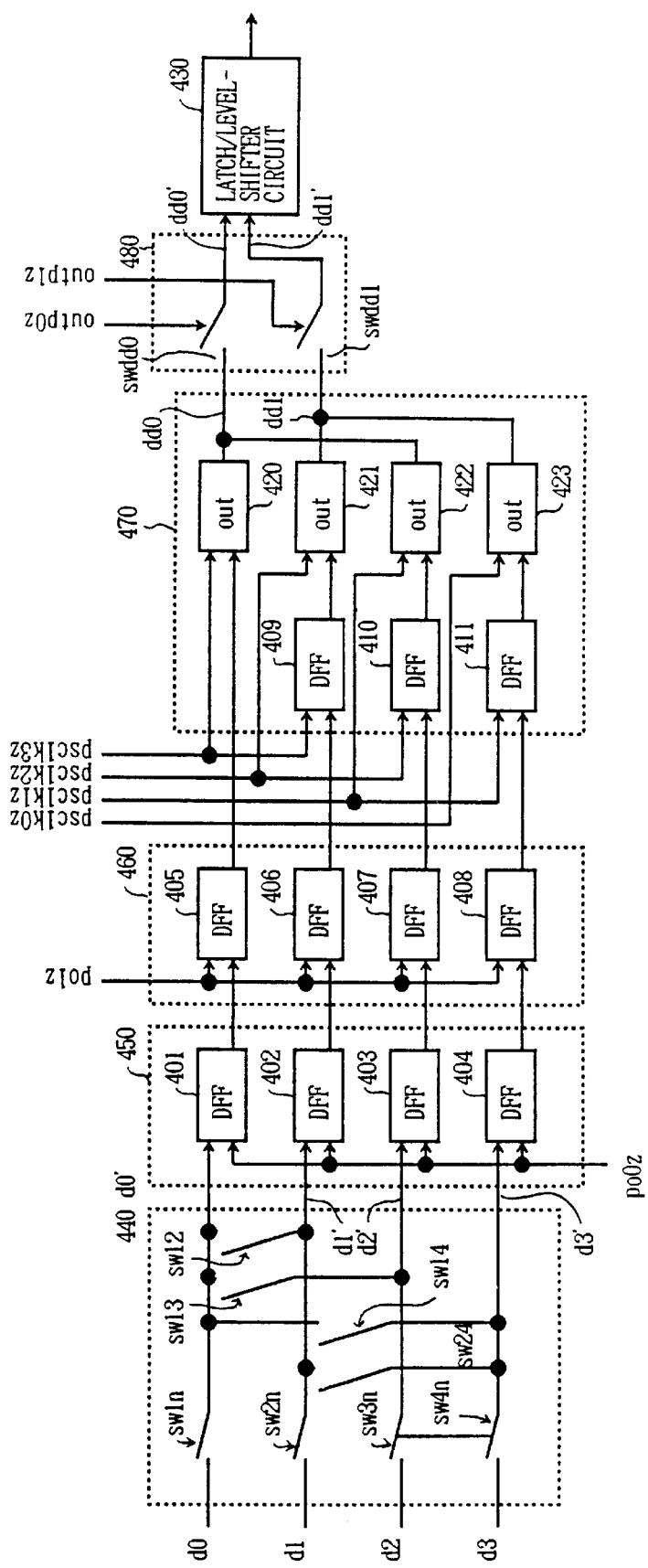
FIG. 31 is a block diagram of another embodiment of the conversion unit.

FIG. 31 is a block diagram of another embodiment of the conversion unit 29.

The conversion unit 29 of this embodiment differs from that of FIG. 15 and FIG. 17 in that a data-bus switch 440 is provided to achieve a similar function to that of the selector-control unit of FIG. 15, and in that a parallel-to-serial conversion is performed by taking two steps, i.e., by converting 4 bits to 2 bits and then 2 bits to 1 bits.

The conversion unit 29 includes a data-bus switch 440, a first register 450, a second register 460, a 4-bit-to-2-bit-conversion circuit 470, a latch&level-shifter circuit 430, and a data-output-timing switch 480. The data-bus switch 440 receives 4-bit parallel data from the read buffer 28, and changes path connections between the input bus lines and the output bus lines based on the burst-length signal and some of the column-address information. The first register 450 and the second register 460 are provided in this order on the output side of the data-bus switch 440. The 4-bit-to-2-bit-conversion circuit 470 converts 4-bit parallel data to 2-bit parallel data when the 4-bit parallel data is output from the second register 460. On the output side of the 4-bit-to-2-bit-conversion circuit 470, the data-output-timing switch 480 is provided, and converts the 2-bit parallel data into one-bit serial data. The latch&level-shifter circuit 430 is provided after the data-output-timing switch 480.

In what follows, a detailed configuration and operations will be described with respect to each element.

The data-bus switch 440 includes switches sw1n, sw2n, and sw3n corresponding to four data-bus lines d0, d1, d2, and d3, a switch sw24 for connecting between the data-bus lines d1 and d3, a switch sw14 for connecting between the data-bus lines d0 and d3, a switch sw13 for connecting between the data-bus lines d0 and d2, and a switch sw12 for connecting between the data-bus lines d0 and d1. These switches are controlled in terms of on/off conditions thereof in accordance with a burst-length signal BL and column-address signals caa0z and caa1z.

FIG. 32 is a table showing a status of each switch with respect to a case in which the burst length BL is 1, 2, or 4. When the burst length BL is 4, the data on the data-bus lines d0 through d3 is transferred to the data-bus lines d0' through d3' without any change. Namely, the switches sw1n, sw2n, and sw3n are switched on (closed), and the switches sw24, sw14, sw13, and sw12 are switched off (open) regardless of statuses of the column-address signals caa0z and caa1z.

When the burst length BL is 2, data on the data-bus lines d0' and d1' are output to outside according to the design specification of this configuration. In this case, therefore, a choice is whether to transfer data from the data-bus lines d0 and d1 to the data-bus lines d0' and d1' or from the data-bus lines d2 and d3 to the data-bus lines d0' and d1'. This choice is made by a logic value of the column-address signal caa0z. When the column-address signal caa0z is set to an L level, a data set of the data-bus lines d0 and d1 is conveyed to the data-bus lines d0' and d1'. In this case, the switches sw1n, sw2n, and sw3n are switched on (closed), and the switches sw24, sw14, sw13, and sw12 are switched off (open). When the column-address signal caa0z is set to an H level, a data set of the data-bus lines d2 and d3 is conveyed to the data-bus lines d0' and d1'. In this case, the switches sw3n, sw24, and sw13 are switched on (closed), and the switches sw1n, sw2n, sw14, and sw12 are switched off (open). Namely, data on the data-bus line d2 is conveyed to the data-bus line d0' via the switch sw13, and data on the data-bus line d3 is conveyed to the data-bus line d1' via the switch sw24. When the burst length BL is 2, a logic value of the other column-address signal caa1z is not relevant to selection of the switches.

When the burst length BL is 1, one bit is selected from the data on the data-bus lines d0, d1, d2, and d3, and is transferred to the data-bus line d0' to be output to outside. The selection of data is made according to a combination of the column-address signals caa0z and caa1z. In order to select the data of the data-bus line d0, both caa0z and caa1z are set to an L level. In this case, the switches sw1n, sw2n, and sw3n are switched on (closed), and the switches sw24, sw14, sw13, and sw12 are switched off (open). The data of the data-bus line d0 is thus passed along to the data-bus line d0'. When the data of the data-bus line d1 needs to be selected, caa0z is set to an H level, and caa1z is set to an L level. This closes the switches sw2n, sw3n, and sw12, and opens the switches sw1n, sw24, sw13. In this case, the data of the data-bus line d1 is transferred to the data-bus line d0'. When the data-bus line d2 or d3 is to be selected, similarly, an on/off status of each switch is determined based on the logic table of FIG. 32.

The parallel data d0'–d3' output from the data-bus switch 440 is first supplied to the first register 450, and is then supplied to the second register 460.

Figure 33:
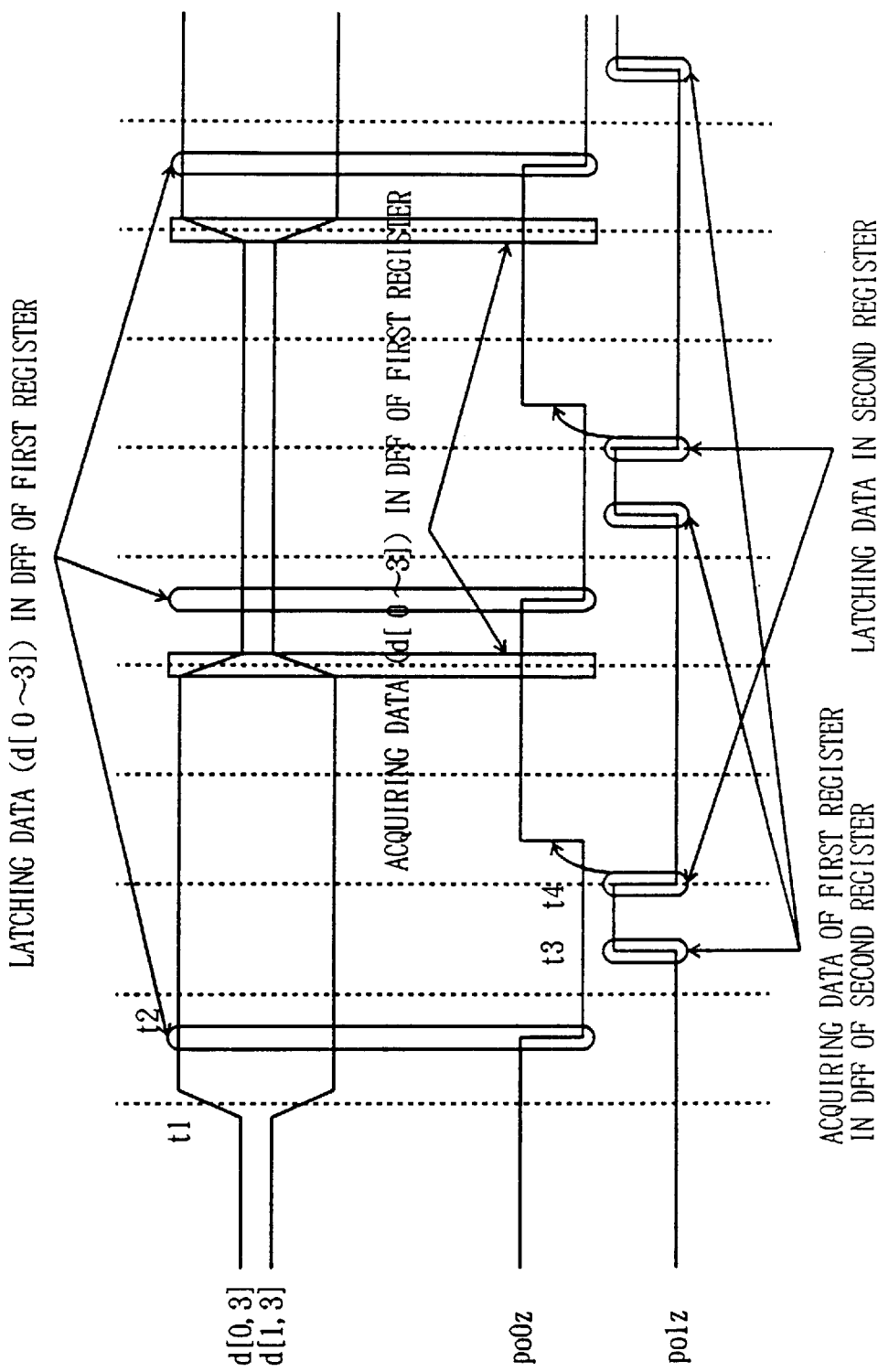
FIG. 33 is a timing chart showing operations of first and second registers.

The first register 450 includes four delayed flip-flops (DFF) 401–404. Each DFF has a data-acquisition timing and a latch timing thereof controlled by a first control signal po0z. The second register 460 includes four delayed flip-flops (DFF) 405–408. Each DFF has a data-acquisition timing and a latch timing thereof controlled by a second control signal po1z. 10 FIG. 33 is a timing chart showing operations of the first and second register 450 and 460. In the figure, d[0,2] represents data on the data-bus lines d0' and d2', and d[1,3] represents data on the data-bus lines d1' and d3'.

At a time t1 in FIG. 33, parallel data appears on the data-bus lines d0'–d3'. At a time t2 following the time t1, the first control signal po0z changes from H to L. This prompts the four delayed flip-flops 401–404 of the first register 450 to latch the data on the data-bus lines d0'–d3'. At a time t3, the second control signal changes from L to H, prompting the four delayed flip-flops 405–408 of the second register 460 to acquire the data latched by the delayed flip-flops 401–404, respectively. At a time t4, the second control signal changes from H to L, so that the four delayed flip-flops 405–408 latch the acquired data. After this, the first control signal changes from L to H. This change makes the four delayed flip-flops 401–404 ready to accept data on the data-bus lines d0'–d3'. In this manner, the parallel data on the data-bus lines d0'–d3' is transferred to the first register 450 and then to the second register 460.

The data latched by the second register 460 is supplied to the 4-bit-to-2-bit-conversion circuit 470, where the 4-bit parallel data is converted into 2-bit parallel data. The 4-bit-to-2-bit-conversion circuit 470 includes delayed flip-flops 409–411 and output-buffer circuits 420–423. The 4-bit-to-2-bit-conversion circuit 470 receives four control-clock signals psclk0z–psclk3z, which control output timings of the output-buffer circuits 420–423 and data-latch timings of the delayed flip-flops 409–411. An output line of the output-buffer circuit 420 and an output line of the output-buffer circuit 422 are commonly connected to a node dd0. This is based on a wired-OR connection. When the output-buffer circuit 420 outputs data, the output of the output-buffer 422 is placed in a high-impedance condition. When the output-buffer circuit 422 outputs data, on the other hand, the output of the output-buffer 420 is placed in a high-impedance condition. The 4-bit-to-2-bit-conversion circuit 470 outputs 2-bit data at the nodes dd0 and dd1, so that the 2-bit data is supplied to the data-output-timing switch 480. The data-output-timing switch 480 includes two switches swdd0 and swdd1, which are controlled in terms of an on/off condition thereof by output-control-clock signals outp0z ad outp1z. The data-output-timing switch 480 first closes the switch swdd0 so as to transfer the data bit at the node dd0 to the latch&level-shifter circuit 430 provided at the next stage, and, then, closes the switch swdd1 so as to transfer the data bit appearing at the node dd1 to the latch&level-shifter circuit 430. In this manner, the data-output-timing switch 480 transfers the two bits appearing at the nodes dd0 and dd1 successively one bit by one bit to the latch&level-shifter circuit 430. The latch&level-shifter circuit 430 latches the received data, and, then, converts the level of the received data to pass the data to the output buffer 30 of FIG. 3.

Figure 34:
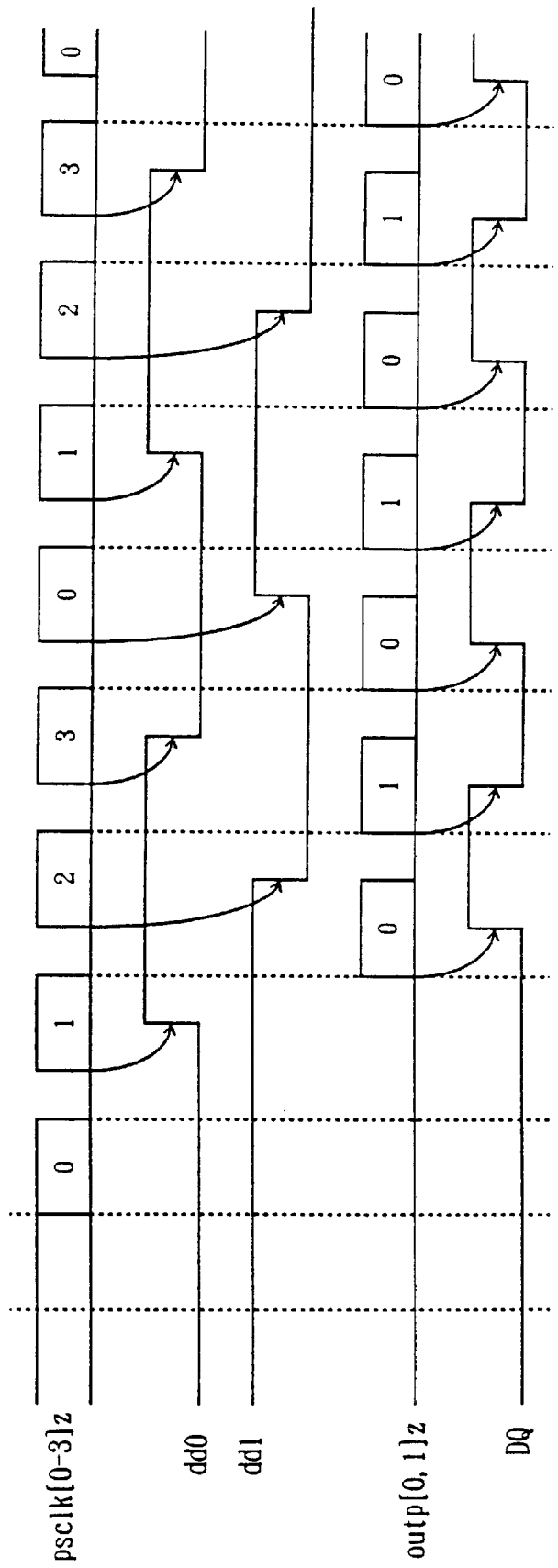
FIG. 34 is timing charts showing operations of a 4-bit-to-2-bit-conversion circuit and a latch&level-shifter circuit when the burst length is 4.

FIG. 34 is timing charts showing operations of the 4-bit-to-2-bit-conversion circuit 470 and the latch&level-shifter circuit 430 when the burst length BL is 4. In the following, operations of these circuits will be described in detail with reference to FIG. 34.

At an initial state, the four DFFs 405–408 of the second register 460 have latched data stored therein.

The four control-clock signals psclk0z–psclk3z for controlling operations of the 4-bit-to-2-bit-conversion circuit 470 supply H pulses in turn in an order of psclk1z, psclk2z, psclk3z, and psclk0z as shown in FIG. 34. When psclk1z becomes H, the output-buffer circuit 420 outputs to the node dd0 data received from the DFF 405. At the same time, the DFF 409 latches data output from the DFF 406. When psclk2 becomes H, the output-buffer circuit 421 outputs to the node dd1 data received from the DFF 409. At the same time, the DFF 410 latches data output from the DFF 407. Such operations as described above are repeated, so that the nodes dd0 and dd1 will have data appearing in turn as shown in FIG. 34 as output data of the 4-bit-to-2-bit-conversion circuit 470.

The DFFs 409–411 of the 4-bit-to-2-bit-conversion circuit 470 are provided in order to achieve continuous data output from the data-output nodes DQ without any break. To this end, the DFFs 409–411 allow the second register 460 to latch a next set of data while the 4-bit-to-2-bit-conversion circuit 470 is attending to the conversion of a current set of data.

The two output-control-clock signals outp0z and outp1z for controlling operations of the data-output-timing switch 480 supply H pulses in turn at such timings as shown in FIG. 34. When new data appears at the node dd0, outp0z becomes H after a predetermined delay. The switch swdd0 is thus switched on to transfer the data at the node dd0 to the latch&level-shifter circuit 430. When new data appears at the node dd1, outp1z becomes H after a predetermined delay. The switch swdd1 is thus switched on to transfer the data of the node dd1 to the latch&level-shifter circuit 430. This operation is repeated again and again so as to transfer the data at the nodes dd0 and dd1 alternately to the latch&level-shifter circuit 430 on a sequential basis, thereby performing the 2-bit-to-1-bit conversion.

What is described above corresponds to a case in which the burst length BL is 4. FIGS. 35A and 35B are tables showing operation conditions of the four control-clock signals psclk0z–psclk3z and the two output-control-clock signals outp0z and outp1z with respect to cases in which the burst length is 1, 2, and 4.

In the case of the burst length BL being 4, all the four control-clock signals psclk0z–psclk3z and the two output-control-clock signals outp0z and outp1z exhibit clocking operations. As a result, the 4-bit parallel data output from the four DFFs 405–408 of the second register 460 is converted into serial data.

When the burst length BL is 2, two control-clock signals psclk1z and psclk2z and the two output-control-clock signals outp0z and outp1z exhibit clocking operations. When the burst length BL is 2, as previously described, data is supplied only to the nodes d0' and d1', and the other nodes d2' and d3' receive no data. Because of this, only the control-clock signals and the output-control-clock signals that are necessary for outputting data from the nodes d0' and d1' to the outside are allowed to exhibit clock operations.

When the burst length BL is 1, one control-clock signal psclk1z and one output-control-clock signal outp0z exhibit clocking operations. As previously described, when the burst length BL is 1, data is supplied only to the node d0', and the other nodes d1'–d3' receive no data. Because of this, only the control-clock signal and the output-control-clock signal that are necessary for outputting data from the node d0' to the outside are allowed to exhibit clock operations.

In this embodiment, the 4-bit data output from the second register 460 is converted into 2-bit data by the 4-bit-to-2-bit-conversion circuit 470, and, then, the 2-bit data is converted into 1-bit data via the data-output-timing switch 480 and the latch&level-shifter circuit 430. Namely, a process of parallel-to-serial data conversion is performed by dividing the process into two steps and by carrying out the two steps successively.

Alternatively, the output-buffer circuits 420–423 of the 4-bit-to-2-bit-conversion circuit 470 may have four outputs thereof connected together via a wired-OR connection, and the data-output-timing switch 480 may be comprised of only one switch. In this case, the data-output-timing switch 480 is implemented by a relatively simple structure using only one switch.

If the clock-signal frequency is increased in an attempt to achieve a faster operation, it becomes increasingly difficult to generate an output-control-clock signal outp#z corresponding to only one switch swdd because of demand for an excessively higher frequency. In such a case, the data-output-timing switch 480 may be comprised of two switches as shown in FIG. 31, and the two output-control-clock signals outp0z and outp1z may be used for controlling these two switches. In this configuration, the two output-control-clock signals are required to have only half the frequency of the only one output-control-clock signal described above.

Figure 36A:
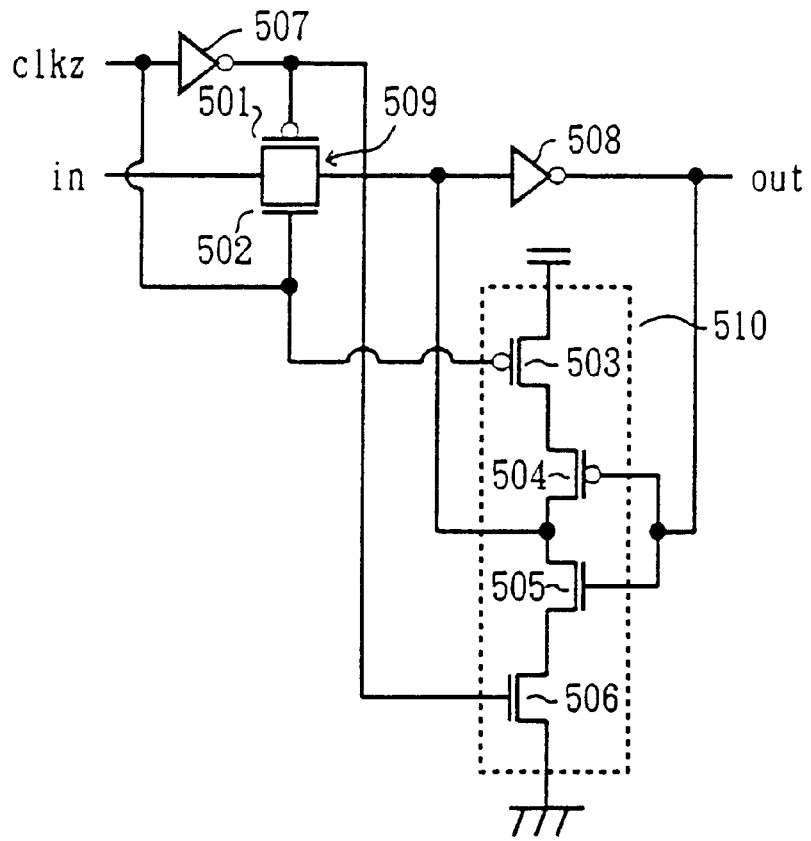
FIG. 36A is a block diagram of a delayed flip-flops shown in FIG. 31.
Figure 36B:
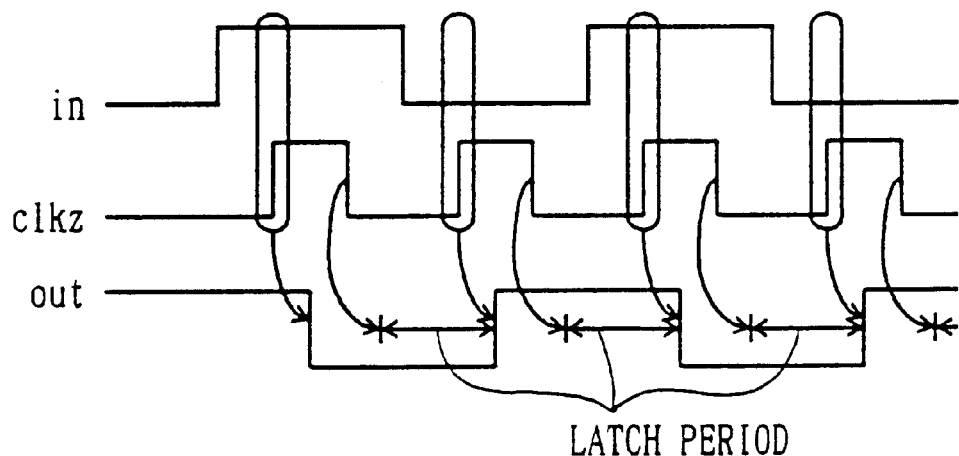
FIG. 36B is a timing chart showing operations of a configuration of FIG. 36A.

FIG. 36A is a block diagram of any one of the delayed flip-flops DDF shown in FIG. 31. FIG. 36B is a timing chart showing operations of the configuration of FIG. 36A.

The delayed flip-flop DFF includes a transfer gate comprised of a PMOS 501 and an NMOS 502, inverters 507 and 508, and a clocked inverter comprised of PMOSs 503 and 504 and NMOSs 505 and 506.

When a clock signal clkz corresponding to one of the control signals po0z, po1z, and psclk0z–psclk3z shown in FIG. 31 is H, the transfer gate 509 is switched on, so that the DFF acquires input data in. While this happens, the clocked inverter 510 is in a switched-off condition. When the clock signal clkz becomes L, the transfer gate 509 is switched off, so that the input data in is separated from the DFF. At the same time, the clocked inverter 510 is activated so as to form a latch with the inverter 508. This latch latches the data which is acquired by the DFF at a moment when the clock signal clkz becomes L.

Figure 37A:
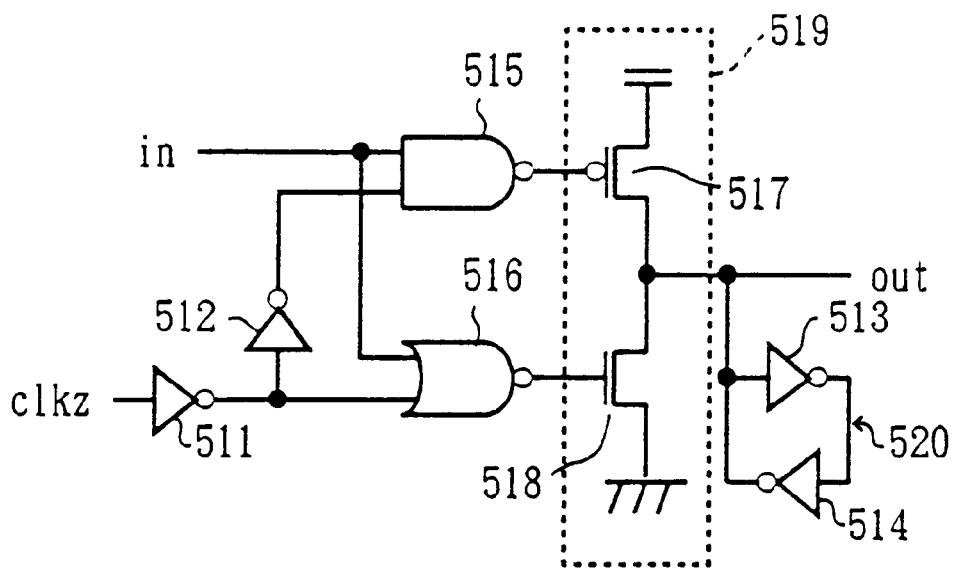
FIG. 37A is a block diagram of an output buffer shown in FIG. 31.
Figure 37B:
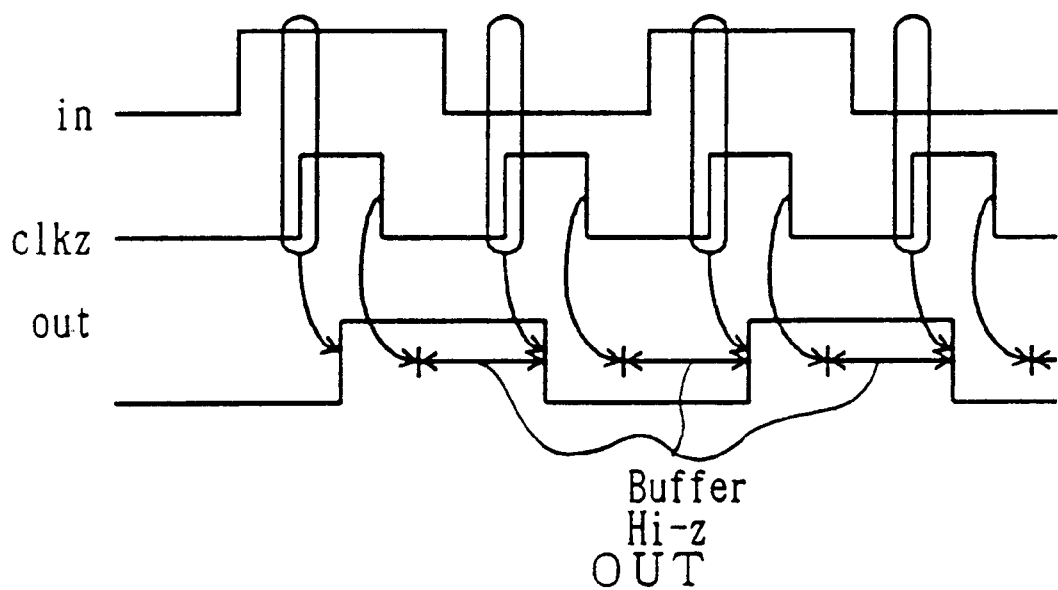
FIG. 37B is a timing chart showing operations of a configuration of FIG. 37A.

FIG. 37A is a block diagram of any one of the output buffers 420–423 shown in FIG. 31. FIG. 37B is a timing chart showing operations of the configuration of FIG. 37A.

An output-buffer circuit of this figure includes inverters 511 and 512, a NAND circuit 515, a NOR circuit 516, a buffer circuit 519 comprised of a PMOS 517 and an NMOS 518, and a latch circuit 520 comprised of inverters 513 and 514.

When a clock signal clkz corresponding to one of the control signals po0z, po1z, and psclk0z–psclk3z shown in FIG. 31 becomes H, the NAND circuit 515 and the NOR circuit 516 function as an inverter, respectively, so that output data having the same phase as input data appears at an output node out. This output data is stored in the latch circuit 520. When the clock signal clk is changed to L, the PMOS 517 and the NMOS 518 are turned off, thereby leaving the output node in a high-impedance condition.

Figure 38:
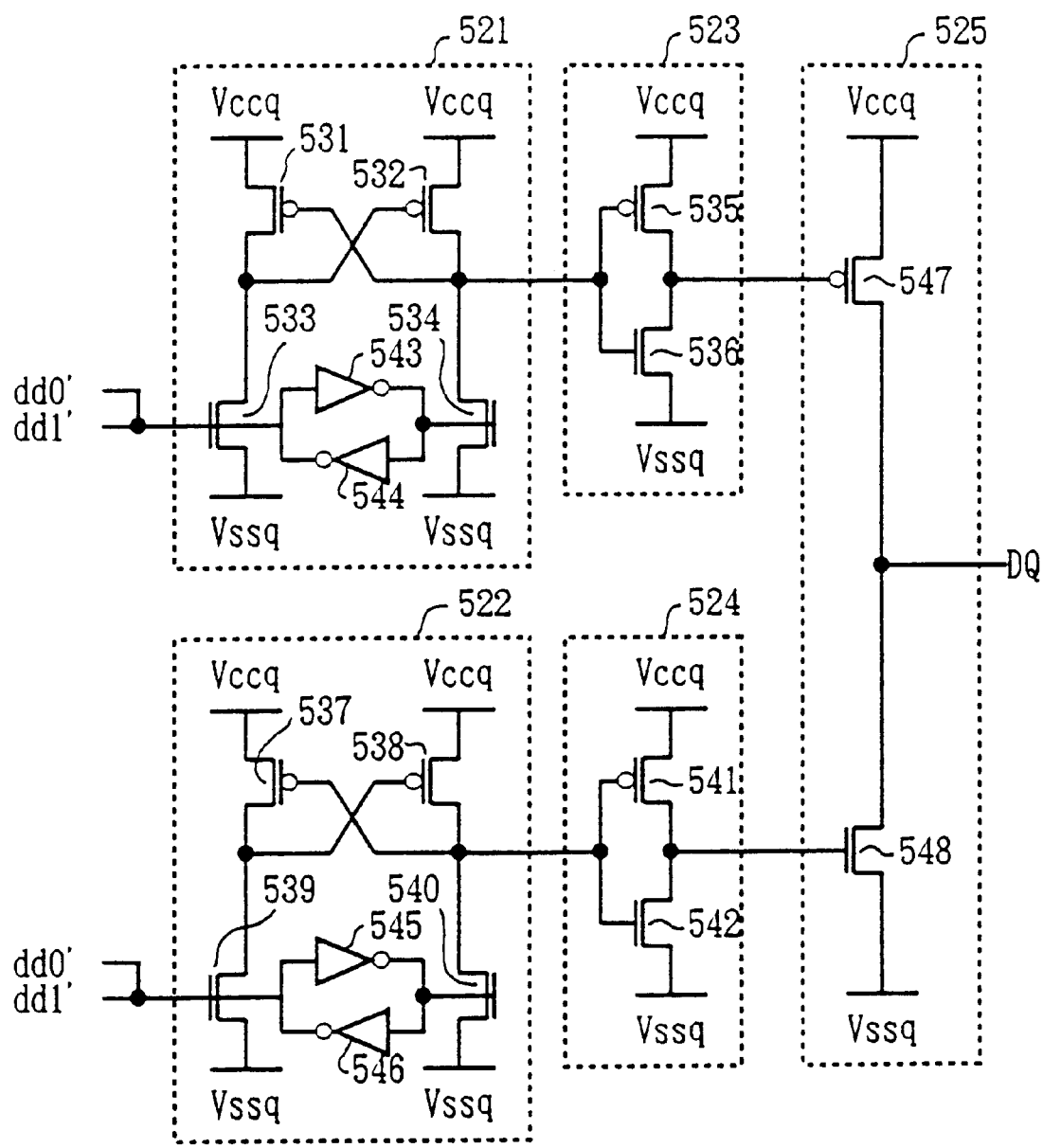
FIG. 38 is a circuit diagram showing a configuration of a latch&level-shifter circuit shown in FIG. 31.

FIG. 38 is a circuit diagram showing a configuration of the latch&level-shifter circuit 403 shown in FIG. 31. In the figure, a portion 525 comprised of a PMOS 547 and an NMOS 548 corresponds to the output-transistor unit 30 shown in FIG. 30.

The latch&level-shifter circuit 403 includes PMOSs 531, 532, NMOSs 533, 534, and inverters 543, 544, all of which together form a level-shift circuit 521 equipped with a latch. The latch&level-shifter circuit 403 further includes a level-shift circuit 522 having an identical configuration, an inverter 523 comprised of a PMOS 535 and an NMOS 536, and an inverter 524 comprised of a PMOS 541 and an NMOS 542. In the figure, Vccq and Vssq are power lines separate from power lines Vii and Vss for internal circuits, so that Vccq is provided with a voltage different from that of Vii, for example.

Gates of the PMOSs 533 and 539 are connected to both the output dd0' and the output dd1' of the data-output-timing switch 480 (see FIG. 31). When data is supplied from the output line dd0', for example, H data of the output line dd0' results in H data being output at the data-output node DQ. By the same token, L data of the output line dd0' results in L data being output at the data-output node DQ.

Alternatively, the level-shift circuit 522 and the inverter 524 may be removed, and the output of the inverter 523 may be supplied as a common input to the gate of the PMOS 547 and to the gate of the NMOS 548. It should be noted, however, that the configuration of FIG. 38 is preferred to this alternative configuration if there is a need to place the data-output node DQ in a high-impedance state.

Further, instead of connecting the gate of the NMOS 539 to the output lines dd0' and dd1', another form of connections may be provided. Namely, the data-output-timing switch 480 of FIG. 31 may be provided another set of switches swdd00 and swdd11 which are controlled by the output-control-clock signals outp0z and outp1z, respectively, and the gate of the NMOS 539 may be connected to the node dd0 via the switch swdd00 and to the node dd1 via the switch swdd11.

Further, the present invention is not limited to these embodiments, but various variations and modifications may be made without departing from the scope of the present invention.

INDUSTRIAL APPLICABILITY

In the present invention, when a series of operations from row-address input to data output is divided into command-decode and peripheral-circuit operations of a first step, sense-amplifier operations of a second step, and data-output operations of a third step, the sense-amplifier operations of the second step have a constant operation period irrespective of a specified burst length. Since the data of the sense amplifiers is read in parallel by simultaneously opening a plurality of column gates, it is sufficient for the sense amplifiers to operate only for a constant time period. This allows the period of the sense-amplifier operations of the second step to be constant, thereby achieving undisturbed row-access pipe-line operations.

If it is incumbent upon the user to determine the precharge timing from outside the semiconductor memory device, arbitrary nature of the precharge timing works as one of the causes to disturb the pipe-line operations. The present invention, however, uses the internal precharge signal to initiate reset operations, so that such a cause of disturbance is eliminated. Further, the precharge operation can be conducted at an optimum timing immediately after the data is read from the sense amplifiers, thereby achieving as high-speed a data-read operation as possible within the limits of the sense-amplifier performance.

What is claimed is:

1. A semiconductor memory device reading out data an access time after receiving a command signal, comprising:
   a row address pin receiving an external row address signal;
   a column address pin receiving an external column address signal;
   a decoding unit receiving the command signal and the row address signal for selecting one of a plurality of word lines coupled with memory cells; and
   sense amplifiers for amplifying voltages on bit lines coupled to said memory cells;
   wherein said decoding unit receives a first command signal and a second command signal following the first command signal for a time interval, and the time interval is shorter than the access time.

2. The semiconductor memory device as claimed in claim 1, wherein the semiconductor memory device receives said external row address signal external column address signal in parallel.

3. The semiconductor memory device as claimed in claim 1, wherein the semiconductor memory device receives said external row address signal and external column address signal concurrently.

4. The semiconductor memory device as claimed in claim 1, wherein the semiconductor receives both of said external row address signal and said external column address signal in conjunction with the command signal.

5. The semiconductor memory device as claimed in claim 1, wherein said access time includes a first operation period for decoding the command signal, a second operation period during which said sense amplifiers are activated, and a third operation period for outputting data from the sense amplifiers.

6. The semiconductor memory device as claimed in claim 5, wherein said second operation period includes a selection period for activating one of said plurality of word lines, an activation period of said sense amplifiers and a reset period for resetting said sense amplifiers and said bit lines.

7. The semiconductor memory device as claimed in claim 5, wherein said third operation period initiates at a timing when column gates, which are controlled by the external column address signal, are selected during the activation period of said sense amplifiers.

8. A semiconductor memory device, comprising:
   a plurality of sense amplifiers which store data via bit lines from memory cells corresponding to a selected word line;
   a column decoder selecting one of column gates associate with said bit lines, in response to a column address; and
   a precharge signal generation unit which generates an internal precharge signal constant delay time after a generation timing of a row access signal for selecting the selected word line so as to reset the bit lines and said plurality of said sense amplifiers.

9. The semiconductor memory device as claimed in claim 8, wherein the constant delay time is longer than a time period required for selecting the selected word line in response to the row access signal, for reading the data to the bit lines from the memory cells corresponding to the selected word line, and for amplifying the data from the bit lines by said plurality of sense amplifiers.

10. The semiconductor memory device as claimed in claim 8, wherein said precharge signal generation unit resets the bit lines and said plurality of sense amplifiers by using said internal precharge signal immediately after the data is read from the selected sense amplifier.

11. The semiconductor memory device as claimed in claim 8, wherein said plurality of sense amplifiers comprises direct sense amplifiers.

* * * * *